(12) United States Patent
Tokuyama et al.

(10) Patent No.: US 10,966,355 B2
(45) Date of Patent: *Mar. 30, 2021

(54) ELECTRIC POWER CONVERSION APPARATUS

(71) Applicant: Hitachi, Ltd., Tokyo (JP)

(72) Inventors: Takeshi Tokuyama, Hitachi (JP); Kinya Nakatsu, Hitachinaka (JP); Ryuichi Saito, Hitachi (JP); Keisuke Horiuchi, Hitachinaka (JP); Toshiya Satoh, Hitachiota (JP); Hideki Miyazaki, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/686,310

(22) Filed: Nov. 18, 2019

(65) Prior Publication Data

US 2020/0093039 A1    Mar. 19, 2020

Related U.S. Application Data

(63) Continuation of application No. 15/483,630, filed on Apr. 10, 2017, now Pat. No. 10,524,398, which is a
(Continued)

(30) Foreign Application Priority Data

Mar. 11, 2008    (JP) .................................. 2008-061185

(51) Int. Cl.
*H05K 7/20*    (2006.01)
*H01L 23/36*    (2006.01)
(Continued)

(52) U.S. Cl.
CPC ........ *H05K 7/20927* (2013.01); *B60L 15/007* (2013.01); *H01L 23/3121* (2013.01);
(Continued)

(58) Field of Classification Search
CPC .................................................... H02M 7/003
See application file for complete search history.

(56) References Cited

U.S. PATENT DOCUMENTS 5,631,821 A    5/1997 Muso
5,740,015 A    4/1998 Donegan et al.
(Continued)

FOREIGN PATENT DOCUMENTS

EP    1 148 547 A2    10/2001
EP    1 172 850 A2    1/2002
(Continued)

OTHER PUBLICATIONS

Japanese Office Action dated May 25, 2010 (Three (3) pages).
(Continued)

*Primary Examiner* — Mukundbhai G Patel
(74) *Attorney, Agent, or Firm* — Crowell & Moring LLP

(57) ABSTRACT

An electric power conversion apparatus includes a channel case in which a cooling water channel is formed; a double side cooling semiconductor module that has an upper and lower arms series circuit of an inverter circuit; a capacitor module; a direct current connector; and an alternate current connector. The semiconductor module includes first and second heat dissipation metals whose outer surfaces are heat dissipation surfaces, the upper and lower arms series circuit is disposed tightly between the first heat dissipation metal and the second heat dissipation metal, and the semiconductor module further includes a direct current positive terminal, a direct current negative terminal, and an alternate current terminal which protrude to outside. The channel case is provided with the cooling water channel which extends from a cooling water inlet to a cooling water outlet, and a first opening which opens into the cooling water channel.

11 Claims, 26 Drawing Sheets

Related U.S. Application Data continuation of application No. 14/822,446, filed on Aug. 10, 2015, now Pat. No. 9,648,791, which is a continuation of application No. 14/686,375, filed on Apr. 14, 2015, now Pat. No. 9,137,932, which is a continuation of application No. 14/546,458, filed on Nov. 18, 2014, now Pat. No. 9,042,101, which is a continuation of application No. 13/788,805, filed on Mar. 7, 2013, now Pat. No. 8,917,509, which is a continuation of application No. 13/152,505, filed on Jun. 3, 2011, now Pat. No. 8,416,574, which is a continuation of application No. 12/388,910, filed on Feb. 19, 2009, now Pat. No. 7,978,471.

(51) Int. Cl.

| | | |
|---|---|---|
| *H01L 23/473* | (2006.01) | |
| *H01L 25/07* | (2006.01) | |
| *H02M 7/00* | (2006.01) | |
| *H01L 23/367* | (2006.01) | |
| *H01L 23/492* | (2006.01) | |
| *H01L 23/495* | (2006.01) | |
| *H05K 1/02* | (2006.01) | |
| *B60L 15/00* | (2006.01) | |
| *H01L 23/31* | (2006.01) | |
| *H01L 23/00* | (2006.01) | |
| *H02M 7/537* | (2006.01) | |
| *H02P 27/06* | (2006.01) | |
| *B60L 50/51* | (2019.01) | |
| *B60K 6/26* | (2007.10) | |
| *B60K 6/28* | (2007.10) | |
| *B60K 6/46* | (2007.10) | |
| *B60K 17/16* | (2006.01) | |

(52) U.S. Cl.
CPC .......... *H01L 23/36* (2013.01); *H01L 23/3675* (2013.01); *H01L 23/473* (2013.01); *H01L 23/492* (2013.01); *H01L 23/49517* (2013.01); *H01L 24/45* (2013.01); *H01L 25/072* (2013.01); *H02M 7/003* (2013.01); *H02M 7/537* (2013.01); *H02P 27/06* (2013.01); *H05K 1/0262* (2013.01); *B60K 6/26* (2013.01); *B60K 6/28* (2013.01); *B60K 6/46* (2013.01); *B60K 17/16* (2013.01); *B60L 50/51* (2019.02); *B60L 2210/40* (2013.01); *B60L 2220/14* (2013.01); *B60L 2240/429* (2013.01); *B60Y 2200/92* (2013.01); *H01L 2224/36* (2013.01); *H01L 2224/40* (2013.01); *H01L 2224/40137* (2013.01); *H01L 2924/0002* (2013.01); *H01L 2924/00014* (2013.01); *H01L 2924/1203* (2013.01); *H01L 2924/13055* (2013.01); *H01L 2924/13091* (2013.01); *H01L 2924/14* (2013.01); *H01L 2924/181* (2013.01); *H05K 7/2089* (2013.01); *Y10S 903/906* (2013.01); *Y10S 903/907* (2013.01); *Y10S 903/909* (2013.01)

(56) References Cited

U.S. PATENT DOCUMENTS

| | | | |
|---|---|---|---|
| 5,966,291 A | 10/1999 | Baumel et al. | |
| 6,166,937 A | 12/2000 | Yamamura et al. | |
| 6,414,867 B2 | 7/2002 | Suzuki et al. | |
| 6,621,701 B2 | 9/2003 | Tamba et al. | |
| 6,661,659 B2 | 12/2003 | Tamba et al. | |
| 7,009,291 B2 | 3/2006 | Oohama | |
| 7,177,153 B2 | 2/2007 | Radosevich et al. | |
| 7,551,439 B2 | 6/2009 | Peugh et al. | |
| 7,646,612 B2 | 1/2010 | Duarte et al. | |
| 7,710,721 B2 | 5/2010 | Matsuo et al. | |
| 7,710,723 B2 | 5/2010 | Korich et al. | |
| 7,742,303 B2 | 6/2010 | Azuma et al. | |
| 7,978,471 B2 | 7/2011 | Tokuyama et al. | |
| 8,174,831 B2 | 5/2012 | Nemesh et al. | |
| 8,240,410 B2 | 8/2012 | Heimbrook et al. | |
| 8,416,574 B2 | 4/2013 | Tokuyama et al. | |
| 8,917,509 B2 | 12/2014 | Tokuyama et al. | |
| 9,042,101 B2 | 5/2015 | Tokuyama et al. | |
| 2001/0014029 A1 | 8/2001 | Suzuki et al. | |
| 2001/0033477 A1 | 10/2001 | Inoue et al. | |
| 2002/0011363 A1 | 1/2002 | Shirakawa | |
| 2003/0067749 A1 | 4/2003 | Tamba et al. | |
| 2004/0061138 A1 | 4/2004 | Shinohara et al. | |
| 2004/0155211 A1* | 8/2004 | Takeda | B01J 19/00 251/61 |
| 2005/0040515 A1 | 2/2005 | Inoue et al. | |
| 2006/0208660 A1 | 9/2006 | Shinmura | |
| 2007/0018197 A1* | 1/2007 | Mochida | H01L 25/105 257/177 |
| 2007/0076355 A1* | 4/2007 | Oohama | H05K 7/20927 361/676 |
| 2007/0109715 A1 | 5/2007 | Azuma et al. | |
| 2007/0216013 A1 | 9/2007 | Funakoshi et al. | |
| 2007/0252169 A1 | 11/2007 | Tokuyama et al. | |
| 2007/0253164 A1 | 11/2007 | Matsuo et al. | |
| 2008/0049476 A1 | 2/2008 | Azuma et al. | |
| 2008/0130223 A1 | 6/2008 | Nakamura et al. | |
| 2008/0186751 A1 | 8/2008 | Tokuyama et al. | |
| 2008/0198548 A1 | 8/2008 | Nakamura et al. | |
| 2008/0225487 A1 | 9/2008 | Nakajima et al. | |
| 2008/0291710 A1 | 11/2008 | Aoki et al. | |
| 2009/0040724 A1 | 2/2009 | Nishikimi et al. | |
| 2009/0231811 A1 | 9/2009 | Tokuyama et al. | |
| 2010/0097765 A1 | 4/2010 | Suzuki et al. | |
| 2010/0165680 A1 | 7/2010 | Yoshinaga | |
| 2010/0188813 A1 | 7/2010 | Nakatsu et al. | |
| 2011/0228479 A1 | 9/2011 | Tokuyama et al. | |
| 2012/0039039 A1 | 2/2012 | Nishikimi et al. | |
| 2013/0094269 A1 | 4/2013 | Maeda et al. | |
| 2013/0119525 A1 | 5/2013 | Tsuyuno et al. | |
| 2013/0279230 A1 | 10/2013 | Suwa et al. | |
| 2014/0092663 A1 | 4/2014 | Shimizu et al. | |
| 2014/0197532 A1 | 7/2014 | Ide et al. | |

FOREIGN PATENT DOCUMENTS

| | | |
|---|---|---|
| EP | 1 855 374 A2 | 11/2007 |
| JP | 8-8395 A | 1/1996 |
| JP | 2000-60149 A | 2/2000 |
| JP | 2001-156225 A | 6/2001 |
| JP | 2001-352023 A | 12/2001 |
| JP | 2004-119667 A | 4/2004 |
| JP | 2004-128099 A | 4/2004 |
| JP | 2004-215335 A | 7/2004 |
| JP | 2005-26627 A | 1/2005 |
| JP | 2005-123233 A | 5/2005 |
| JP | 2005-175130 A | 6/2005 |
| JP | 2005-175163 A | 6/2005 |
| JP | 2005-237141 A | 9/2005 |
| JP | 2006-202899 A | 8/2006 |
| JP | 2007-53295 A | 3/2007 |
| JP | 2007-251076 A | 9/2007 |
| JP | 2007-295765 A | 11/2007 |
| JP | 2007-299781 A | 11/2007 |
| JP | 2008-29117 A | 2/2008 |
| JP | 2008-193867 A | 8/2008 |
| JP | 2008-259267 A | 10/2008 |

OTHER PUBLICATIONS

Japanese Office Action dated Jan. 5, 2010 (Three (3) pages).
Japanese Office Action dated Dec. 4, 2012 w/English translation (seven (7) pages).
Japanese-language Office Action dated Dec. 4, 2012 (two (2) pages).

(56) References Cited

OTHER PUBLICATIONS

European Search Report issued in counterpart European Application No. 12195707.0 dated Aug. 11, 2015 (five (5) pages).
European Search Report issued in counterpart European Application No. 09002478.7 dated Aug. 5, 2015 (six (6) pages).
Japanese-language Office Action issued in counterpart Japanese Application No. 2017-235677 dated Oct. 17, 2018 with English translation (12 pages).

* cited by examiner

FIG.25A
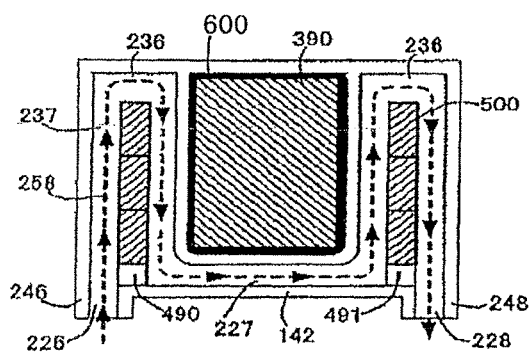
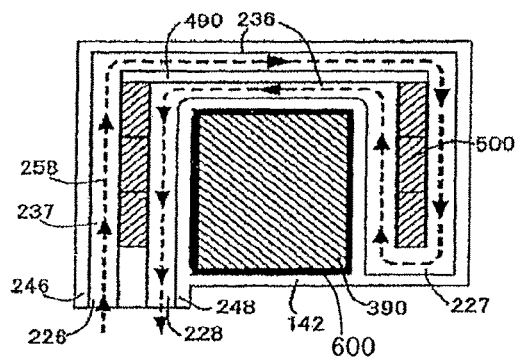
FIG.25B
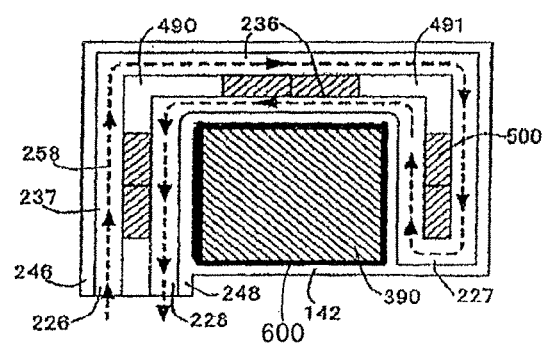
FIG.25C

ELECTRIC POWER CONVERSION APPARATUS

CROSS REFERENCE TO RELATED APPLICATIONS

This application is a continuation of Ser. No. 15/483,630, filed on Apr. 10, 2017 which is a continuation of U.S. patent application Ser. No. 14/822,446, filed Aug. 10, 2015, now U.S. Pat. No. 9,648,791, issued May 9, 2017, the priority of which is claimed here, which is a continuation of U.S. patent application Ser. No. 14/686,375, filed Apr. 14, 2015, now U.S. Pat. No. 9,137,932, issued Sep. 15, 2015, the priority of which is claimed here, which is a continuation of U.S. patent application Ser. No. 14/546,458, filed Nov. 18, 2014, now U.S. Pat. No. 9,042,101, issued May 26, 2015, the priority of which is claimed here, which is a continuation of U.S. patent application Ser. No. 13/788,805, filed Mar. 7, 2013, now U.S. Pat. No. 8,917,509, issued Dec. 23, 2014, the priority of which is claimed here, which is a continuation of U.S. patent application Ser. No. 13/152,505, filed Jun. 3, 2011, now U.S. Pat. No. 8,416,574, issued Apr. 9, 2013, the priority of which is claimed here, which is a continuation of U.S. patent application Ser. No. 12/388,910, filed Feb. 19, 2009, now U.S. Pat. No. 7,978,471, issued Jul. 12, 2011, the priority of which is claimed here, and which in turn claims priority under 35 U.S.C. § 119 to Japanese Patent Application No. 2008-061185, filed Mar. 11, 2008, the priority of which is also claimed here, the entire disclosures of which afore-mentioned documents are herein expressly incorporated by reference.

BACKGROUND OF THE INVENTION

1. Field of the Invention

The present invention relates to an electric power conversion apparatus that includes an inverter circuit.

2. Description of Related Art

As a conventional technology intended to increase heat dissipation efficiency of a semiconductor module by efficiently transferring heat from the semiconductor module to a cooler, patent reference literature 1 (Japanese Laid Open Patent Publication No. 2005-175163) discloses, for example, a cooling structure. According to the description of patent reference literature 1, a semiconductor module is inserted in a hole formed in a cooler for inserting a semiconductor module to allow heat to be released from a surface of the semiconductor module that abuts the hole for inserting the module. More particularly, a layer of soft metal is applied on the surface of the semiconductor module that abuts the hole for inserting the module so that heat is released to the cooler through the layer of the soft metal.

A conventional technology intended to balance the cooling efficiency and the assemblability of a semiconductor element for use in an inverter includes, for example, an inverter disclosed in patent reference literature 2. According to the description of patent reference literature 2 (Japanese Laid Open Patent Publication No. 2005-237141), an accommodating portion that accommodates a power card of which both sides of a semiconductor device are sandwiched by heat dissipation plates and a cycling path that circulates a coolant around the power card is formed, and an insulating resin is filled between the power card and the accommodating portion, and the insulating resin is cured to fix the power card.

A conventional technology for a cooling structure intended to improve cooling capacity with a decreased burden of assembling a semiconductor module is disclosed in, for example, patent reference literature 3. According to the description of patent reference literature 3 (Japanese Laid Open Patent Publication No. 2006-202899), a block is provided in which a semiconductor module is housed inside thereof and heat dissipation planes are provided on its front and rear sides to dissipate Joule heat generated in the semiconductor module. The block is inserted into a cooling water channel formed in a case so as to cause the front and rear sides of the block to face the cooling water channel.

A conventional technology of a cooling structure that is capable of cooling a smoothing capacitor as well as cooling both sides of a semiconductor module is disclosed in, for example, patent reference literature 4 (Japanese Laid Open Patent Publication No. 2001-352023). According to the description of patent reference literature 4, semiconductor modules are provided on each side of a smoothing capacitor, and a switchback-shaped flat coolant tube is used to form a coolant channel along the both sides of the semiconductor modules and along the smoothing capacitor, achieving a high level of heat dissipation efficiency without leakage.

In recent years, in automobiles, for example, various in-vehicle systems for vehicles including a drive system for a vehicle are operated electrically. In order to electrically operate the in-vehicle systems, it becomes necessary to add freshly or in place of a component of the conventional system an electrical machine that drives a driven body and an electric power conversion apparatus that controls the power supplied to a rotating electrical machine from an in-vehicle power source in order to control driving of the rotating electrical machine.

The electric power conversion apparatus, e.g. for an automobile, has functions to convert direct current power supplied from the in-vehicle power source to alternating current power for driving a rotating electrical machine and to convert alternating current power generated by the rotating electrical machine to direct current power for supplying to the in-vehicle power source. While electrical energy converted by an electric power conversion apparatus tends to increase, automobiles tend to be small in size and weight in general. Thus, increase in size and weight of an electric power conversion apparatus is limited. An in-vehicle electric power conversion apparatus, in comparison with an industrial one, is required to be used in an environment with great temperature change. Therefore, an electric power conversion apparatus relatively small in size that converts high power and assures a high level of reliability even in a high-temperature environment is required.

The electric power conversion apparatus includes an inverter circuit and performs power conversion between direct current power and alternating current power by the operation of the inverter circuit. In order to perform this power conversion, it is necessary to repeat action of switching between a blocked state and a conduction state of a power semiconductor that constitutes the inverter circuit (switching action). When the switching action is performed, a large amount of heat is generated in the power semiconductor. Because of the heat generated by a semiconductor chip, which is the power semiconductor of the inverter circuit, upon the switching action, the temperature of the semiconductor chip is increased. For this reason, it is important to prevent this temperature increase.

According as power to be converted increases, the amount of heat generated in the semiconductor chip increases. To cope with this, it is necessary to increase the size of the semiconductor chip or the number of the semiconductor chips to be used, resulting in an increase in size of the electric power conversion apparatus. As a measure of preventing such an increase in size of the electric power conversion apparatus, it is conceivable to improve cooling efficiency of the semiconductor chips.

For example, patent reference literatures 1 to 3 present proposals to increase the cooling efficiency of the semiconductor chips. Although improvement in cooling efficiency of a semiconductor chip obviously leads to miniaturization in the semiconductor chip, it does not necessarily contribute to size reduction of the overall electric power conversion apparatus. For instance, an improvement in cooling efficiency of a semiconductor chip may result in a complex structure of the overall electric power conversion apparatus. Thus, although the semiconductor chip may be miniaturized, the overall electric power conversion apparatus may not be miniaturized significantly.

Accordingly, in order to prevent an increase in size of the overall electric power conversion apparatus, it is necessary to improve the cooling efficiency of the semiconductor chip with the overall electric power conversion apparatus considered, and necessary to prevent electrical or mechanical complexity in the overall electrical power conversion apparatus. The electrical complexity results from, for example, complex electrical wiring between the semiconductor module having a semiconductor chip incorporated therein and a capacitor module, a driver board, or an alternate current connector. The mechanical complexity results from complex mounting of a semiconductor module to the channel case or complex mounting of a capacitor module.

In the technologies disclosed in the patent reference literatures 1 to 3, miniaturization of the overall electric power conversion apparatus is not sufficiently considered, and specific disclosure of the disposition of capacitor modules or the cooling structure is insufficient. The patent reference literature 4 discloses a disposition structure in which the cooling of a smoothing capacitor, in addition to the cooling of a semiconductor module, is intended. However, the disposition structure does not adopt a water-cooling method but employs a cooling method with which the semiconductor module and the smoothing capacitor are cooled through a coolant tube connected to a coolant pipe of an external refrigeration cycle device. Furthermore, an arrangement of other components such as a circuit board that is connected to the semiconductor module is not elaborated, thereby leaving an issue in miniaturization of the overall electric power conversion apparatus.

The present invention is to provide a technology for miniaturization of an overall electric power conversion apparatus. The electric power conversion apparatus according to an embodiment of the present invention described hereinafter intends to provide not only the technology for miniaturization but also improvement in reliability, productivity, and cooling efficiency, which are necessary to commercialize the device.

SUMMARY OF THE INVENTION

An electric power conversion apparatus according to a first aspect of the present invention comprises: a channel case in which a cooling water channel is formed; a double side cooling semiconductor module that comprises an upper and lower arms series circuit of an inverter circuit; a capacitor module; a direct current connector; and an alternate current connector, wherein: the semiconductor module comprises a first and a second heat dissipation metals whose outer surfaces are heat dissipation surfaces, the upper and lower arms series circuit is disposed tightly between the first heat dissipation metal and the second heat dissipation metal, and the semiconductor module further comprises a direct current positive terminal, a direct current negative terminal, and an alternate current terminal which protrude to outside; the channel case is provided with the cooling water channel which extends from a cooling water inlet to a cooling water outlet, and a first opening which opens into the cooling water channel through which the semiconductor module is inserted into the cooling water channel in a removable manner; the channel case is further provided with a second opening through which the capacitor module is placed; the first opening for the semiconductor module is disposed on both sides of the second opening for the capacitor module; and a plurality of the semiconductor module are arranged through the first opening provided on the both sides so that a long side of the first heat dissipation metal and the second heat dissipation metal of each of the semiconductor modules is set along a direction along which cooling water flows.

An electric power conversion apparatus according to a second aspect of the present invention comprises: a channel case in which a cooling water channel is formed; a double side cooling semiconductor module that comprises an upper and lower arms series circuit of an inverter circuit; a capacitor module; a direct current connector; and an alternate current connector, wherein: the semiconductor module comprises a first and a second heat dissipation metals whose outer surfaces are heat dissipation surfaces, the upper and lower arms series circuit is disposed tightly between the first heat dissipation metal and the second heat dissipation metal, and the semiconductor modules further comprises a direct current positive terminal, a direct current negative terminal, and an alternate current terminal which protrude to outside; the channel case is provided with the cooling water channel which extends from a cooling water inlet to a cooling water outlet, and a first opening which opens into the cooling water channel through which the semiconductor module is inserted into the cooling water channel in a removable manner; the channel case is further provided with a second opening through which the capacitor module is placed; the first opening for the semiconductor module is disposed on both sides of the second opening for the capacitor module; and a driver board, on which a drive element for driving the inverter circuit constituted with the upper and lower arms series circuit is mounted, is provided on an upper surface of the capacitor module placed through the second opening, and a control board, on which a control element for controlling the inverter circuit is mounted, is provided on the driver board.

An electric power conversion apparatus according to a third aspect of the present invention comprises: a channel case in which a cooling water channel is formed; a double side cooling semiconductor module that comprises an upper and lower arms series circuit of an inverter circuit; a capacitor module; a direct current connector; and an alternate current connector, wherein: the semiconductor module comprises a first and a second heat dissipation metals whose outer surfaces are heat dissipation surfaces, the upper and lower arms series circuit is disposed tightly between the first heat dissipation metal and the second heat dissipation metal, and the semiconductor module further comprises a direct current positive terminal, a direct current negative terminal, and an alternate current terminal which protrude to outside;

the channel case is provided with the cooling water channel which extends from a cooling water inlet to a cooling water outlet, and a first opening which opens into the cooling water channel through which the semiconductor module is inserted into the cooling water channel in a removable manner; the channel case is further provided with a second opening through which the capacitor module is placed; the first opening for the semiconductor module is disposed on both sides of the second opening for the capacitor module; and each of the first heat dissipation metal and the second heat dissipation metal of the semiconductor module comprises, in its outer surface, a fin-shaped part with recesses through which the cooling water flows, and the semiconductor module is inserted firmly through the first opening on the both sides.

An electric power conversion apparatus according to a fourth aspect of the present invention comprises: a channel case in which a cooling water channel is formed; a double side cooling semiconductor module that comprises an upper and lower arms series circuit of an inverter circuit; a capacitor module; a direct current connector; and an alternate current connector, wherein: the semiconductor module comprises a first and a second heat dissipation metals whose outer surfaces are heat dissipation surfaces, the upper and lower arms series circuit is disposed tightly between the first heat dissipation metal and the second heat dissipation metal, and the semiconductor module further comprises a direct current positive terminal, a direct current negative terminal, and an alternate current terminal which protrude to outside; the channel case is provided with the cooling water channel which extends from a cooling water inlet to a cooling water outlet, and a first opening which opens into the cooling water channel through which the semiconductor module is inserted into the cooling water channel in a removable manner; the channel case is further provided with a second opening through which the capacitor module is placed; the first opening for the semiconductor module is disposed on both sides of the second opening for the capacitor module; and a positive terminal and a negative terminal of the capacitor module are connected to the direct current positive terminal and the direct current negative terminal of the semiconductor module respectively through a connecting member identical to one another in shape and in length.

According to a fifth aspect of the present invention, in the power conversion device according to the fourth aspect, the capacitor module houses a plurality of capacitor blocks; and a positive terminal and a negative terminal of each of the capacitor blocks are connected to the direct current positive terminal and the direct current negative terminal of each of the semiconductor modules respectively through a connecting member identical to one another in shape and in length.

According to a sixth aspect of the present invention, in the electric power conversion apparatus according to the first aspect, in addition to the first opening provided on the both sides of the second opening for the capacitor module, a return opening is provided to link the first opening on one side and the first opening on another side with each other, and the cooling water channel is configured so that the cooling water makes U-turns at three locations throughout the cooling water channel.

According to a seventh aspect of the present invention, in the electric power conversion apparatus according to the sixth aspect, the cooling water inlet and the cooling water outlet are provided on a front side surface of the channel case, with one of the cooling water inlet and the cooling water outlet disposed on either right or left side of the front side surface, and the return opening is provided on a front side of the channel case; the semiconductor modules comprise a first semiconductor module disposed on the one side of the second opening for the capacitor module, and a second semiconductor module disposed on the other side of the second opening for the capacitor module, with the second heat dissipation metal of each of the first and second semiconductor modules facing toward the capacitor module; and the cooling water channel is configured so that the cooling water flows in order from the cooling water inlet, a first heat dissipation metal of the first semiconductor module, a second heat dissipation metal of the first semiconductor module, a path formed by the return opening on the front side, a second heat dissipation metal of the second semiconductor module, a first heat dissipation metal of the second semiconductor module, to a cooling water outlet section.

According to a eighth aspect of the present invention, in the electric power conversion apparatus according to the sixth aspect, the cooling water inlet and the cooling water outlet are provided on a front side surface of the channel case on one of a right side and a left side of the front side surface, and the return opening is provided on a side opposite from the front side surface of the channel case; the semiconductor modules comprise a first semiconductor module disposed on the one side of the second opening for the capacitor module, and a second semiconductor module disposed on the other side of the second opening for the capacitor module, with the second heat dissipation metal of each of the first and second semiconductor modules facing toward the capacitor module; and the cooling water channel is configured so that the cooling water flows in order from the cooling water inlet, a first heat dissipation metal of the first semiconductor module, a path formed by the return opening on the opposite side, a first heat dissipation metal of the second semiconductor module, a second heat dissipation metal of the second semiconductor module, the path formed by the return opening on the opposite side, a second heat dissipation metal of the first semiconductor module, to the cooling water outlet.

According to a ninth aspect of the present invention, in the electric power conversion apparatus according to the eighth aspect, the semiconductor modules further comprises a third semiconductor module disposed in the path formed by the return opening on the opposite side, in addition to the first semiconductor module disposed in a path on the one side and the second semiconductor module disposed in a path on the other side; and the first semiconductor module, the second semiconductor module and the third semiconductor module each correspond to one of three phases.

According to a tenth aspect of the present invention, in the electric power conversion apparatus according to the first aspect, a first semiconductor module group comprising a first inverter circuit constituted with first upper and lower arms series circuits for U-phase, V-phase, and W-phase is arranged through the first opening provided on one side of the second opening for the capacitor module; and a second semiconductor module group comprising a second inverter circuit constituted with second upper and lower arms series circuits for U-phase, V-phase, and W-phase is arranged through the first opening provided on another side of the second opening for the capacitor module.

According to a eleventh aspect of the present invention, the electric power conversion apparatus according to the first aspect 10 further comprises: a driver board, disposed on an upper surface of the capacitor module, that drives an inverter circuit of each semiconductor module, and that bridges between the first semiconductor module group and the second semiconductor module group to be used for both the first semiconductor module group and the second semiconductor module group.

According to a twelfth aspect of the present invention, in the electric power conversion apparatus according to the second aspect, the channel case is formed at least with a lower case and an upper case; a direct current connection member that connects terminals of the capacitor module and the semiconductor module with each other, an alternate current connection member that connects an alternate current terminal of the semiconductor module and the alternate current connector, the driver board, and the control board are provided in this order on the upper surface of the capacitor module which is placed through the second opening provided in the lower case; and the upper case is fitted on the lower case so as to house the direct current connection member, the alternate current connection member, the driver board, and the control board.

According to a thirteenth aspect of the present invention, in the electric power conversion apparatus according to the first aspect, the semiconductor module comprises an upper arm IGBT chip, an upper arm diode chip, a lower arm IGBT chip, and a lower diode chip; and the upper arm IGBT chip and the lower arm IGBT chip are arranged on a same level surface along a direction of the cooling water flowing through the first and second heat dissipation metals.

According to a fourteenth aspect of the present invention, in the electric power conversion apparatus according to the first aspect, the channel case comprises an accommodating portion to house the capacitor module inserted through the second opening; and a thermal conduction resin is filled between an inner wall of the accommodating portion and an outer wall of the capacitor module.

According to a fifteenth aspect of the present invention, in the electric power conversion apparatus according to the first aspect, the channel case comprises an accommodating portion to house the capacitor module inserted through the second opening; and a thermal conduction grease is applied to an inner wall of the accommodating portion and an outer wall of the capacitor module.

Other objects, advantages and novel features of the present invention will become apparent from the following detailed description of one or more preferred embodiments when considered in conjunction with the accompanying drawings.

BRIEF DESCRIPTION OF THE DRAWINGS

FIGS. 25A to 25C show explanatory diagrams illustrating configuration examples of a water channel and a plurality of semiconductor modules according to the present embodiment.

DESCRIPTION OF PREFERRED EMBODIMENTS

Figure 1:
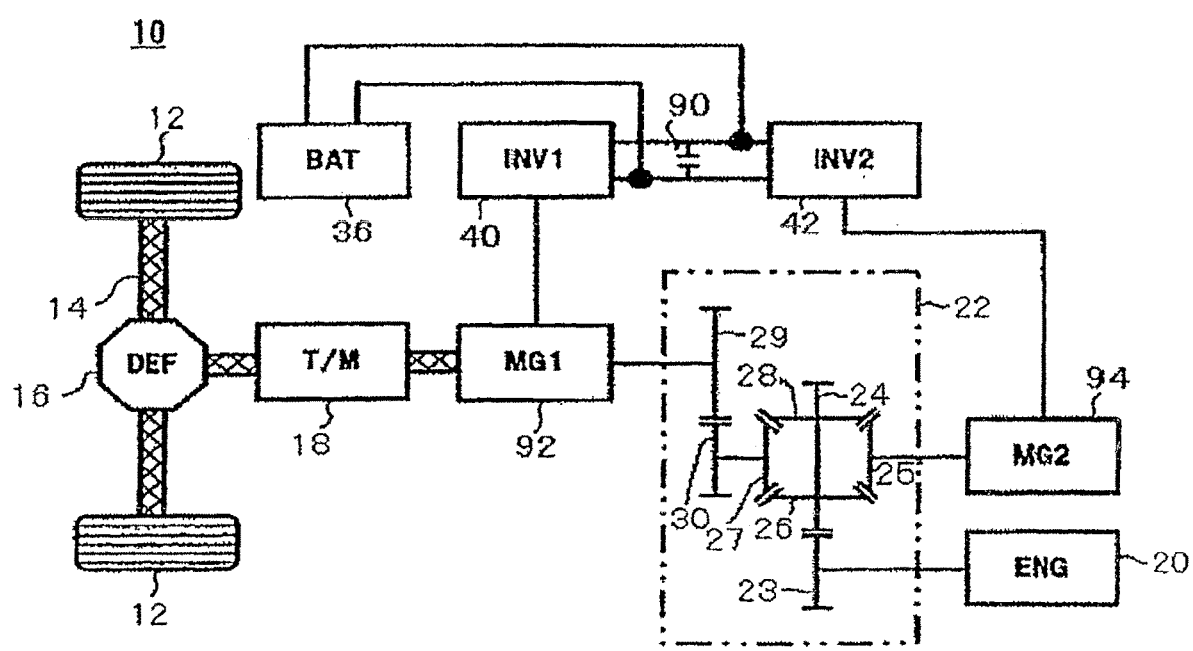
FIG. 1 is a block diagram presenting a control block of a hybrid automobile.

The characteristic features of an embodiment of the present invention is summarized as below. The embodiment of the present invention is configured to include a semiconductor module in which heat dissipation metals sandwich a semiconductor chip for an upper arm and a semiconductor chip for a lower arm that constitute a series circuit having an upper arm and a lower arm of an inverter circuit, a channel case which also functions as a lower case for cooling the semiconductor module, a center opening and side openings provided on the center and both sides of the center opening of the channel case, a capacitor module slotted in the center opening and the semiconductor modules slotted in the side openings, so as to cool the capacitor module, in addition to the semiconductor modules, in the channel case. Moreover, a driver board, a control board, and an alternate current bus bar are provided on the upper surface of the capacitor module for the purpose of miniaturization. A resin or grease with thermal conduction characteristics is filled in a gap between an inner wall of the center opening and an outer wall of the capacitor module after the capacitor module is slotted in the center opening of the channel case, thereby cooling the capacitor module effectively.

The following is a detailed description of a semiconductor module according to an embodiment of the present invention with reference to the attached drawings. First, technical problems on improvements and innovations on the electric power conversion apparatus according to the present embodiment and the outline of the technology to solve the technical problems are described.

The electric power conversion apparatus according to the embodiment of the present invention is made taking into consideration the following technical viewpoints so that they meet needs. One of the viewpoints is a technology of miniaturization, that is, a technology of preventing an electric power conversion apparatus from increasing in size as much as possible, which tends to increase with an increase in power to be converted. Another one of the viewpoints is a technology related to improvement of reliability of the electric power conversion apparatus. Yet another one of the viewpoints is a technology related to improvement of productivity of the electric power conversion apparatus. The electric power conversion apparatus according to the embodiment of the present invention is designed according to each of the above-mentioned three viewpoints, and moreover, a viewpoint combined the above mentioned viewpoints. The features of the electric power conversion apparatus in the respective viewpoints are outlined hereinbelow.

(1) Explanation on Miniaturization Technology

The electric power conversion apparatus according to the present embodiment has the following structure. That is, a series circuit of the upper and lower arms of an inverter is housed in a semiconductor module with a cooling metal on each side. The semiconductor module is immersed in cooling water (slot-in structure) to cool the cooling metal on each side of the semiconductor module with the cooling water. With this structure, cooling efficiency is improved, achieving miniaturization of the semiconductor module. As a specific structure, an electric insulation member such as an electric insulation sheet or an electric insulation plate made of a ceramic plate is provided on the inner side of the cooling metal on each side of the semiconductor module, and semiconductor chips of the upper arm and the lower arm that constitute the upper and lower arms series circuit are sandwiched between the conductor metals fixed to the respective electric insulation members. With this structure, a good thermal conduction path is established between the both sides of the semiconductor chips of the upper and the lower arms and the cooling metals, so that the cooling efficiency of the semiconductor module is greatly improved.

Semiconductor chips (IGBT chips and diode chips) of the upper arm and semiconductor chips of the lower arm of the semiconductor module are arranged with a shift with respect to a direction of flow of the cooling water. The IGBT chips of the upper and the IGBT chips of the lower arms are arranged on the same level surface as the flow of the cooling water. These arrangements achieves a vertical width that is appropriated for the fin-shaped cooling metal to cool the IGBT chips of the upper and lower arms series circuit larger than a vertical width that is appropriated for cooling the diode chips. Thus, the IGBT chips, which have larger heat dissipation, are effectively cooled. In other words, a larger amount of the cooling water is assured to cool the IGBT chips of the upper and lower arms than to cool the diode chips thereof, thereby significantly improving the cooling efficiency.

The both sides of each of the semiconductor chips of the upper arms and the lower arms are connected to respective conductor metals (conducting plates) on the inner side of the cooling metal. The respective conductor metals are fixed to the cooling metal through the electric insulation member. The insulation member is configured to be thin, with a ceramic plate being 350 μm thin or thinner, and an electric insulating sheet being 50 μm to 200 μm thin. The electric insulation sheet includes a thermocompressively bonded resin sheet. Since the conductor metal is provided close to the cooling metal, eddy current is generated due to current flowing in the conductor metal and flows in the cooling metal to generate heat. The heat thus generated can be efficiently conducted to the cooling water.

The eddy current decreases the inductance in the semiconductor module. The decrease in the inductance results in a decrease in voltage spike results from a switching operation of the semiconductor chips of the upper arms and the lower arms, thereby improving the reliability. By suppressing voltage rise, it is possible to perform a faster switching operation of the semiconductor chips of the upper arms and the lower arms, thereby reducing the time for the switching operation and reducing the amount of heat generated by the switching operation.

The capacitor module and the semiconductor module are contained in a channel case of a substantially same plane. In addition, the capacitor module is sandwiched between the semiconductor modules. Thus, miniaturization is achieved. Furthermore, a driver board for driving the semiconductor chips and a control board for controlling the semiconductor chips are provided on the upper surface of the capacitor module, so that the upper surface of the capacitor module is effectively used, thereby achieving the miniaturization.

(2) Explanation on Improvement of Reliability

As described above, the electric power conversion apparatus according to the present embodiment significantly improves the cooling efficiency of the semiconductor module. This suppresses temperature rise of the semiconductor chips, thereby improving reliability.

A plurality of the semiconductor modules sandwich the capacitor module. The direct current positive terminals and the direct current negative terminals of the semiconductor modules are arranged at regular intervals from the capacitor module. This configuration enables these DC terminals and the positive side terminal and the negative side terminal of the capacitor module to be connected with each other using uniformly shaped direct current bus bars. Thus, low inductance between the semiconductor modules and the capacitor module is achieved, while low inductance in the semiconductor module is realized through the internal configuration of the semiconductor module, thereby reducing voltage spike caused by a switching operation and improving the reliability. By restricting voltage rise, a faster switching operation of the semiconductor chips is enabled, thereby reducing the time for the switching operation and reducing the amount of heat generated by the switching operation. This prevents temperature of the semiconductor chips from rising, thereby improving reliability.

As explained above, the structure with which the DC terminal of the semiconductor module is connected to the capacitor module and the terminal structure of the capacitor module become simpler. This leads not only to improvement of productivity and miniaturization but also to improvement of the reliability of the semiconductor module.

In the electric power conversion apparatus of the present embodiment, the cooling efficiency is improved to a greater extent so that the engine cooling water can be used as a cooling water. Therefore, the automobile does not need any dedicated cooling water system and the system of the automobile in whole can be made simpler, thus presenting improvement with high reliability.

The electric power conversion apparatus of the present embodiment is configured such that the semiconductor module that houses the series circuit of the upper and lower arms of the inverter is inserted in the cooling water channel through an opening provided in the cooling water channel and fixed to the cooling water channel. There can be performed a process in which the semiconductor module and the channel case separately produced in different production lines are separately checked and then the semiconductor module is fixed to the channel case. In this manner, the semiconductor module, which is an electric component, and the channel case, which is a mechanical component, can be separately produced and checked, so that not only improvement of productivity but also improvement of reliability can be obtained.

It is possible to adopt a method in which a conductor or a semiconductor chip as necessary is fixed to a first and a second heat dissipation metals and then the first and the second heat dissipation metals are integrated to produce a semiconductor module. It is possible to perform the process of integrating the heat dissipation metals after the state of production of the first and the second heat dissipation metals is confirmed. This leads not only to improvement of productivity but also to improvement of reliability of the semiconductor module.

The electric power conversion apparatus according to the present embodiment is configured such that when the collector surface of the semiconductor chip of the upper arm is fixed to the first heat dissipation metal, the collector surface of the semiconductor chip of the lower arm is fixed to the same first heat dissipation metal, so that the collector surface and the emitter surface of the semiconductor chips of the upper and the lower arms are in the same direction. With this configuration, the productivity and reliability of the semiconductor module is improved.

The electric power conversion apparatus according to the present embodiment is configured such that the semiconductor chip of the upper and the lower arms as well as the signal terminals of and the gate terminals of the upper and the lower arms are fixed to the same heat dissipation metal. For this reason, the process of wire bonding to connect the semiconductor chip with the signal terminal and the gate terminal can be concentrated on one of the heat dissipation metals, which makes it easier to perform the tests. This improves not only productivity but also reliability of the electric power conversion apparatus.

The semiconductor modules of U-phase, V-phase, and W-phase are arranged on each side of the capacitor module of the sandwich structure in the channel case. This arrangement reduces the number of U-turn points of the cooling water channel, thereby reducing pressure drop in the channel, lowering source pressure of the cooling water, and controlling cooling water leaks. Thus, reliability is ensured. Moreover, the capacitor module is disposed in the cooling water channel provided on the substantially same plane. The inner wall of the channel case and the outer wall of the capacitor module are thermally bonded using thermally conductive material (resin or grease). This configuration enables the capacitor module, as well as the semiconductor module, to be directly cooled, stabilizing the performance of these modules and contributing to improvement in reliability of power conversion device.

(3) Explanation on Improvement of Productivity

As mentioned above, the electric power conversion apparatus according to the present embodiment may be configured such that the semiconductor module and the cooling case are separately produced and then a process of fixing the semiconductor modules to the cooling case is performed, so that the semiconductor modules can be produced on the production line for an electrical system. This improves the productivity and reliability of the electric power conversion apparatus. Also, the capacitor module can be separately produced in another production process in the same manner as above and then fixed to the channel case, so that the productivity thereof is improved.

The semiconductor module and the capacitor module can be fixed to the channel case and then the terminals of the semiconductor module and the capacitor module can be connected to each other. Moreover, a space in which a welding machine for the connection is brought to a section to be welded can be secured. This leads to improvement of the productivity. In this connection process, the terminals of the semiconductor module are fixed to the heat dissipation metals, and the heat upon welding the terminals diffuses to the heat dissipation metals, so that adverse influences to semiconductor chips can be avoided, resulting in improvement in the productivity and reliability of the electric power conversion apparatus.

The semiconductor chip of the upper and the lower arms as well as the signal terminals of and the gate terminals of the upper and the lower arms can be fixed to one of the heat dissipation metals of the semiconductor module, so that wire bonding for both the upper arms and the lower arms can be performed on the production line of one of the heat dissipation metals. This improves the productivity of the heat conversion device.

The electric power conversion apparatus according to the present embodiment enables mass production of semiconductor modules of the same structure and enables a method in which a necessary number of semiconductor modules are used based on the specification required for the electric power conversion apparatus. This makes it possible to perform mass production of standardized semiconductor modules to improve the productivity, to reduce the cost, and to improve the reliability of the semiconductor module. As discussed above, the electric power conversion apparatus according to the embodiment of the present invention is designed to achieve the characteristic structures and effects based on the three technical viewpoints. The explanation of the electric power conversion apparatus will be now described.

Embodiment

Figure 2:
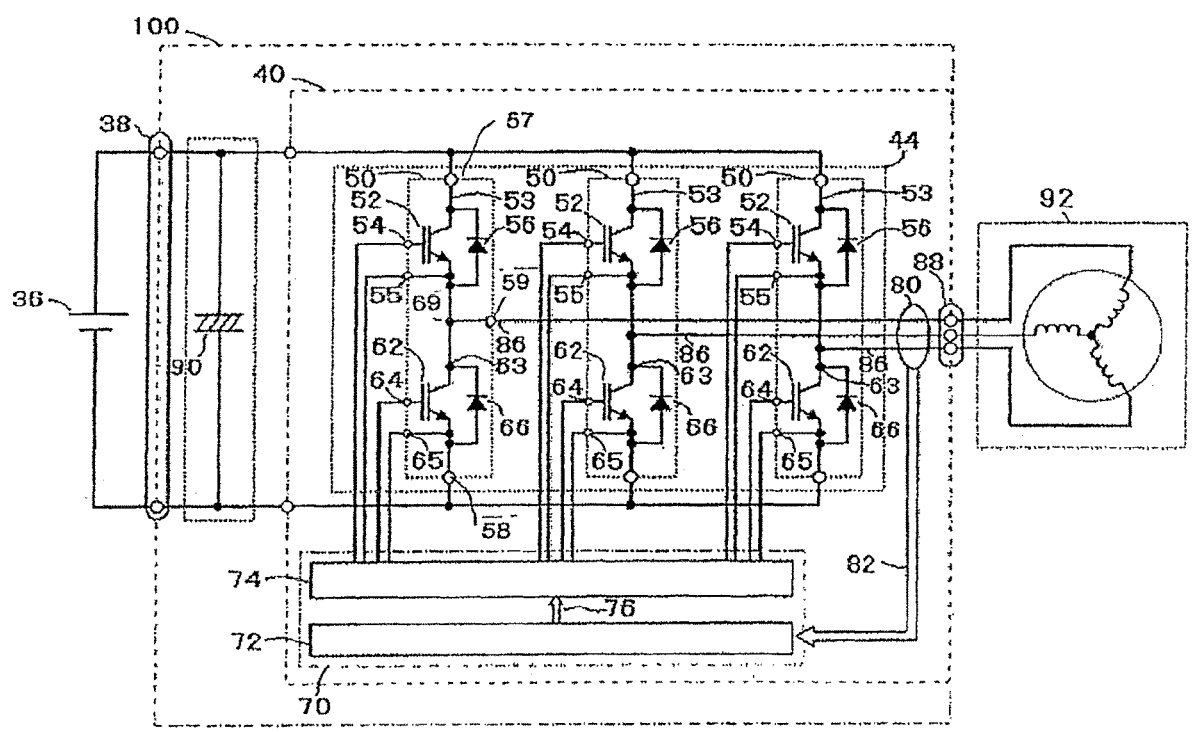
FIG. 2 is a diagram illustrating circuitry of an electric system for driving a vehicle that is provided with an inverter device including an upper and lower arms series circuit and a control unit, an electric power conversion apparatus constituted by capacitors connected to the direct current side of the inverter device, a battery, and a motor generator.

Now, referring to the attached drawings, the electric power conversion apparatus according to an embodiment of the present invention is described in detail. The electric power conversion apparatus of the embodiment present invention is applicable to hybrid automobiles and pure electric cars. A typical example of control mechanism and circuitry of the electric power conversion apparatus when the electric power conversion apparatus according to the present embodiment is applied to the hybrid automobile is described with reference to FIGS. 1 and 2. FIG. 1 is a diagram presenting a control block of a hybrid automobile. FIG. 2 is a diagram illustrating circuitry of an electric system for driving a vehicle that includes an electric power conversion apparatus constituted of an inverter device having an upper and lower arms series circuit and a capacitor connected to the upstream side of the inverter device, a battery, and a motor generator.

The electric power conversion apparatus according to the embodiment of the present invention is described taking as an example of an in-vehicle electric power conversion apparatus for an in-vehicle electric system to be mounted on an automobile, in particular an inverter device for driving a vehicle for use in an electric system for driving a vehicle, which is placed under severe mounting and operating environments. The inverter device for driving a vehicle is included in an electric system for driving a vehicle as a control device that controls driving of a rotating electrical machine for driving a vehicle. The inverter device converts direct current power supplied from an in-vehicle battery or an in-vehicle power generation device that constitutes an in-vehicle power source to predetermined alternate current power and supplies the obtained alternate current power to the rotating electrical machine for driving the vehicle to control the driving of the rotating electrical machine. Because the rotating electrical machine also has the function to serve as a power generation device, the inverter device for driving the vehicle has a function to convert the alternate current power generated by the rotating electrical machine to direct current power in accordance with the driving mode. The converted direct current power is supplied to the in-vehicle battery.

While the configuration of the electric power conversion apparatus according to the present embodiment is also applicable to inverter devices to be used other than for driving a vehicle, for instance, an inverter device to be used as a control device for an electrically-operated braking device or an electrically-operated power steering device, the electric power conversion apparatus exhibits most desirable effect when applied to the inverter device for driving the vehicle. The concept of the electric power conversion apparatus is applicable to other in-vehicle electric power conversion apparatuses, for example, a DC-DC power conversion device or an AC-DC power conversion device, such as a DC/DC converter or a DC chopper. However, when applied to an electric power conversion apparatus for driving a vehicle, the electric power conversion apparatus according to the present embodiment exhibits the most desirable effects. Furthermore, the concept of the electric power conversion apparatus is applicable to an industrial electrical power conversion apparatus used as a control device for a rotating electrical machine that drives plant facilities, or also applicable to a household electrical power conversion device used as a control device for a rotating electrical machine that drives a household photovoltaic power generation system or a household appliance. However, as described above, when applied to an electric power conversion apparatus for driving a vehicle, the electric power conversion apparatus according to the present embodiment exhibits the most desirable effects.

Explanation is made on the electric power conversion apparatus according to the present embodiment taking as an example in which the electric system for driving a vehicle equipped with the inverter device for driving the vehicle to which the present embodiment is applied is mounted on a hybrid automobile. The hybrid automobile is configured to use an engine, which is an internal combustion engine, and a rotating electrical machine for driving a vehicle as driving power sources and either one of front and rear wheels is driven. Hybrid automobiles may be configured such that the engine drives one of the front and rear wheels and the rotating electrical machine for driving the vehicle drives the other of the front and rear wheels. The present embodiment is applicable to any of the types of the hybrid automobiles. As mentioned above, the present embodiment is applicable to pure electric automobiles such as a fuel battery car. In the pure electric vehicles, the electric power conversion apparatus detailed hereinbelow operates substantially in the same manner and substantially the same effects can be obtained.

Referring to FIG. 1, a hybrid electric vehicle (herein after, referred to as "HEV") 10 is an electric vehicle that includes two systems for driving the vehicle. One is an engine system that uses an engine 20, which is an internal combustion engine, as a power source. The engine system is used mainly as a driving power source for HEV. The other is an in-vehicle electric system that uses motor generators 92 and 94 as a driving power source. The in-vehicle electric system is used mainly as a driving power source for HEV and an electric power generation source for HEV. The motor generators 92 and 94, which may be, for example, permanent magnet synchronous motors, can operate either as motors or generators depending on the operation mode. Accordingly, the device is referred to as "motor generator".

In the front part of a vehicle main body, a front axle 14 is rotatably journaled. On both ends of the front axle 14 are provided a pair of front wheels 12. On the rear part of the body, a rear axle is rotatably journaled (not shown). On the both ends of the rear axle are provided a pair of rear wheels. In the HEV according to the present embodiment, a so-called front wheel driving method is adopted. In the front wheel driving method, a main wheel that is power-driven is the front wheel 12 and the trailing wheel is the rear wheel. A reversed driving method, that is, a so-called rear wheel driving method may also be adopted.

In the center of the front wheel shaft 14 is provided a differential gear (herein after, referred to as "front wheel DEF") 16. The front axle 14 is mechanically connected with an output side of the front wheel DEF 16. An input side of the front wheel DEF 16 is mechanically connected with an output shaft of a transmission 18. The front wheel DEF 16 is a differential power transfer mechanism that distributes rotational drive force transmitted with its speed changed by the transmission 18 to right and left front axles 14. An input side of the transmission 18 is mechanically connected with an output side of the motor generator 92. An input side of the motor generator 92 is mechanically connected with an output side of the engine 20 and an output side of the motor generator 94 through a power transfer mechanism 22. The motor generators 92 and 94 and the power transfer mechanism 22 are housed in a casing of the transmission 18.

The power transfer mechanism 22 is a differential mechanism that includes gears 23 to 30. The gears 25 to 28 are bevel gears. The gears 23, 24, 29, and 30 are spur gears. The motive energy of the motor generator 92 is directly transmitted to the transmission 18. The shaft of the motor generator 92 is coaxial with the shaft of the gear 29. With this configuration, when no drive power is supplied to the motor generator 92, the power transmitted to the gear 29 is directly transmitted to the input side of the transmission 18 without any change.

When the engine 20 operates to drive the gear 23, the motive energy of the engine 20 is transmitted from the gear 23 to the gear 24, from the gear 24 to the gears 26 and 28, and then from the gears 26 and 28 to the gear 30, and finally to the gear 29. When the motor generator 94 operates to drive the gear 25, the rotation of the motor generator 94 is transmitted from the gear 25 to the gears 26 and 28 and then from the gears 26 and 28 to the gear 30, and finally to the gear 29. The power transfer mechanism 22 may employ other mechanisms including a planetary gear mechanism in place of the above-mentioned differential mechanism.

The motor generators 92 and 94 are synchronous machines each including a rotor with a permanent magnet. The driving of the motor generators 92 and 94 is controlled by controlling alternate current supplied to armature coils of stators by inverter devices 40 and 42, respectively. The inverter devices 40 and 42 are electrically connected with a battery 36. Power can be supplied and received between the battery 36 and the inverter devices 40 and 42.

In the present embodiment, there are provided a first motor generator unit constituted by the motor generator 92 and the inverter device 40 and a second motor generator unit constituted by the motor generator 94 and the inverter device 42, which are selectively used depending on the driving situation. That is, assuming that the vehicle is driven through motive energy from the engine 20, if the drive torque of the vehicle is to be assisted, the second motor generator unit is actuated as a generator unit by the motive energy from the engine 20 to generate electric power, and the first motor generator is actuated as a motor unit by the generated electric power. Similarly, in the case where the vehicle is driven through motive energy from the engine 20, if the speed of the vehicle is to be assisted, the first motor generator unit is actuated as a generator unit by the motive energy of the engine 20 to generate electric power, and the second motor generator unit is actuated as a motor unit by the generated electric power.

In the present embodiment, the vehicle can be driven only by the motive energy of the motor generator 92 by actuating the first motor generator unit as a motor unit by the electric power from the battery 36. In the present embodiment, the battery 36 can be charged by actuating the first or the second generator unit as a generator unit by the motive energy from the engine 20 or the motive energy from the wheels to perform power generation.

Now, referring to FIG. 2, the electric circuit configurations of the inverter devices 40 and 42 are described. In the embodiment shown in FIGS. 1 and 2, explanation is made on a case where the inverter devices 40 and 42 are separately constructed. However, as described later on referring to FIG. 7 and so on, the inverter devices 40 and 42 may be housed in one device. The inverter devices 40 and 42 have the same construction to exhibit the same action and have the same function, and hence explanation is made on the inverter device 40 as a representative example.

The electric power conversion apparatus 100 according to the present embodiment includes the inverter device 40, a capacitor 90, a direct current connector 38, and an alternate current connector 88. The inverter device 40 includes an inverter circuit 44 and a control unit 70. The inverter circuit 44 includes a plurality of upper and lower arms series circuits 50 (in the example shown in FIG. 2, three upper and lower arms series circuits 50, 50, and 50). Each of the upper and lower arms series circuit 50 includes an IGBT (Insulated Gate type Bipolar Transistor) 52 and a diode 56, which operate as an upper arm, and an IGBT 62 and a diode 66, which operate as a lower arm. Each of the upper and lower arms series circuits 50 is configured such that an alternate current power line 86 extends from a neutral point (intermediate electrode 69) of the upper and lower arms series circuit 50 to the motor generator 92 through an AC terminal 59. The control unit 70 includes a driver circuit (incorporated in a driver board) 74 that drives and controls the inverter circuit 44 and a control circuit 72 (incorporated in a control board) that supplies control signals to the driver circuit 74 through a signal line 76.

The IGBTs 52 and 62 of the upper arm and the lower arm, respectively, are power semiconductor elements for switching. The IGBTs 52 and 62 operate when they receive drive signals output from the control unit 70 and convert direct current power supplied from the battery 36 into three phase alternate current power. The converted power is supplied to the armature coil of the motor generator 92. Also, as mentioned above, the IGBTs 52 and 62 are capable of converting the three phase alternate current power generated by the motor generator 92 into direct current power.

The electric power conversion apparatus 100 according to the present embodiment is constituted with a three-phase bridge circuit. And the upper and lower arms series circuits 50, 50, and 50 each for one of three phases are electrically connected in parallel between the positive side and the negative side of the battery 36. The upper and lower arms series circuit 50, which is called "arms" herein, includes the power semiconductor device 52 for switching and the diode 56 on the upper arm side as well as the power semiconductor device 62 for switching and the diode 66 on the lower arm side.

In the present embodiment, use of IGBTs (Insulated Gate type Bipolar Transistors) 52 and 62 as power semiconductor devices for switching is exemplified. The IGBTs 52 and 62 include collector electrodes 53 and 63, emitter electrodes, gate electrodes (gate electrode terminals 54 and 64), and signal emitter electrodes (signal emitter electrode terminals 55 and 65). The diodes 56 and 66 are electrically connected to between the collector electrodes 53 and 63 and the emitter electrodes of the IGBT 52 and 62, respectively, as shown in the figure. The diodes 56 and 66 include each two electrodes, i.e., cathode and anode. The cathodes of the diodes are connected to the collector electrodes of the IGBTs 52 and 62 and the anodes of the diodes are electrically connected to the emitter electrodes of the IGBTs 52 and 62, respectively, so that a direction from the emitter electrodes to the collector electrodes of the IGBTs 52 and 62 is set as a forward direction.

The power semiconductor for switching may be a MOSFET (Metal Oxide Semiconductor Field Effect Transistor). The MOSFET includes three electrodes, i.e., a drain electrode, a source electrode, and a gate electrode. The MOSFET includes a parasitic diode between the source electrode and the drain electrode such that a direction from the drain electrode to the source electrode is set as a forward direction. For this reason, unlike the IGBT, it is unnecessary to provide a diode separately.

There are provided three upper and lower arms series circuit 50. The three circuits 50 correspond to respective phases of armature coils of the motor generator 92. The three upper and lower arms series circuit 50, 50, and 50 form U-phase, V-phase, and W-phase to the motor generator 92 through the intermediate electrodes 69, each of which connects the emitter electrode of the IGBT 52 and the collector electrode 63 of the IGBT 62, and the AC terminals 59, respectively. The upper and lower arms series circuits are electrically connected in parallel to each other. The collector electrode 53 of the upper arm IGBT 52 is electrically connected to a capacitor electrode on the positive electrode side of the capacitor 90 through a positive electrode terminal (P terminal) 57. The emitter electrode of the lower arm IGBT 62 is electrically connected to a capacitor electrode on the negative electrode side of the capacitor 90 through a negative electrode terminal (N terminal) 58. The intermediate electrode 69, which corresponds to a neutral point of each arm (a connecting part between the emitter electrode of the upper arm IGBT 52 and the collector electrode of the lower arm IGBT 62), is electrically connected to a corresponding phase coil among the armature coils of the motor generator 92 through an AC connector 88. In the present embodiment, as described hereinafter in detail, the single upper and lower arms series circuit 50 constituted by the upper and the lower arms serves as a main circuit component of the semiconductor module.

The capacitor 90 is to constitute a smoothing circuit that suppresses variation of direct current voltage generated by the switching action of the IGBTs 52 and 62. The positive side of the battery 36 is electrically connected to the capacitor electrode of the capacitor 90 on the positive electrode side through the direct current connector 38. The negative side of the battery 36 is electrically connected to the capacitor electrode of the capacitor 90 on the negative electrode side through the direct current connector 38. With this construction, the capacitor 90 is connected to between the collector electrode 53 of the upper arm IGBT 52 and the positive of the battery 36 and to between the emitter electrode of the lower arm IGBT 62 and the negative side of the battery 36, so that the capacitor 90 is electrically connected to the battery 36 and the upper and lower arms series circuit 50 in parallel.

The control unit 70 is provided in order to actuate the IGBTs 52 and 62. The control unit 70 includes the control circuit 72 (incorporated in the control board) that generates timing signals for controlling switching timings of the IGBTs 52 and 62 based on information input from other control unit, a sensor, and so on and the driver circuit 74 (incorporated in the driver board) that generates drive signals for causing the IGBTs 52 and 62 to perform switching action based on the timing signals output from the control circuit 72.

The control circuit 72 includes a microcomputer that calculates switching timing of the IGBTs 52 and 62. To the microcomputer, input information is input, which includes a target torque value required for the motor generator 92, a value of the current to be supplied to the armature coils of the motor generator 92 from the upper and lower arms series circuit 50, and a position of a magnetic pole of the rotor of the motor generator 92. The target torque value is set based on a command signal output from a superordinate control unit not shown in the figure. The current value is determined based on the detection signal output from a current sensor 80. The position of magnetic pole is determined based on the detection signal output from a rotating magnetic pole sensor (not shown) provided in the motor generator 92. In the present embodiment, explanation is made on an example in which current values for three phases are detected. However, it would also be acceptable that current values for two phases are detected.

The microcomputer in the control circuit 72 calculates current command values along d and q axes of the motor generator 92 based on the target torque value, calculates voltage command values along the d and q axes of the motor generator 92 based on differences between the calculated current command values along the d and q axes and the detected current values along the d and q axes, and converts the calculated voltage command values into the voltage command values for U-phase, V-phase, and W-phase based on the detected positions of magnetic pole. The microcomputer generates a pulsed modulation wave based on comparison between a fundamental harmonic (sine wave) based on the voltage command values for U-phase, V-phase, and W-phase and a carrier wave (triangle wave), and outputs the generated modulation wave to the driver circuit 74 as PWM (Pulse Width Modulated) signals. The microcomputer outputs to the driver circuit 74 six PWM signals corresponding to the upper and the lower arms for respective phases. The timing signals output from the microcomputer may be other signals such as square waves.

The driver circuit 74 is constituted by an integrated circuit, so-called driver IC, which is obtained by integrating a plurality of electronic circuit components into one. In the present embodiment, explanation is made taking an example in which each of the upper arm and lower arm for each phase is provided with one IC (one arm in one module: one in one). It would also be acceptable to construct the driver circuit 74 such that one IC is provided so as to correspond to each arm which includes the upper and lower arms for each phase (two in one) or such that one IC is provided so as to correspond to all the arms (six in one). The driver circuit 74 amplifies a PWM signal when a lower arm is driven and outputs the amplified PWM signal as a drive signal to the gate electrode of the IGBT 62 of the corresponding lower arm. When an upper arm is driven, the driver circuit 74 amplifies a PWM signal after shifting a level of a reference potential of the PWM signal to a level of a reference potential of the upper arm, and outputs the amplified signal as a drive signal to the gate electrode of the IGBT 52 of the corresponding upper arm. With this, each of the IGBTs 52 and 62 performs a switching action based on the input drive signal.

The control unit 70 performs detection of abnormalities (overcurrent, overvoltage, overtemperature, and so on) to protect the upper and lower arm series circuits 50. For this purpose, sensing information is input to the control unit 70. For example, information on the current that flows through the emitter electrode of each of the IGBTs 52 and 62 is input from the signal emitter electrode terminals 55 and 65 in each arm to the corresponding driving unit (IC). With this, each driving unit (IC) performs overcurrent detection and when overcurrent is detected, the driving unit (IC) stops the switching action of the corresponding one of the IGBTs 52 and 62 in order to protect the corresponding one of the IGBTs 52 and 62 from the overcurrent. Information on the temperature of the upper and lower arms series circuit 50 is input from the temperature sensor (not shown) provided in the upper and lower arms series circuit 50 into the microcomputer. In addition, information on the voltage of the direct current positive electrode side of the upper and lower arms series circuit 50 is input to the microcomputer.

The microcomputer performs overtemperature detection and overvoltage detection based on these pieces of information. When overtemperature or overvoltage is detected, the microcomputer causes the switching actions of all of the IGBTs 52 and 62 to stop in order to protect the upper and lower arms series circuit 50 (consequently, the semiconductor module including this circuit 50) from the overtemperature or the overvoltage.

In FIG. 2, the upper and lower arms series circuit 50 is a series circuit constituted by the IGBT 52 of the upper arm, the diode 56 of the upper arm, the IGBT 62 of the lower arm, and the diode 66 of the lower arm. The IGBTs 52 and 62 are semiconductor elements for switching. Conduction and blocking actions of the IGBTs 52 and 62 of the upper and the lower arms in the inverter circuit 44 are switched in a predetermined order and the current of the stator coil of the motor generator 92 upon the switching flows in a circuit formed by the diodes 56 and 66.

The upper and lower arms series circuit 50, as shown, includes the positive terminal (P terminal) 57, the negative terminal (N terminal) 58, the AC terminal 59 (see FIG. 3) from the intermediate electrode 69 of the upper and the lower arms, the signal terminal (signal emitter electrode terminal) 55 of the upper arm, the gate (base) electrode terminal 54 of the upper arm, the signal terminal (signal emitter electrode terminal) 65 of the lower arm, and the gate (base) electrode terminal 64 of the lower arm. The electric power conversion apparatus 100 includes the direct current connector 38 on the input side and the alternate current connector 88 on the output side and is electrically connected to the battery 36 and the motor generator 92 through the connectors 38 and 88, respectively.

Figure 3:
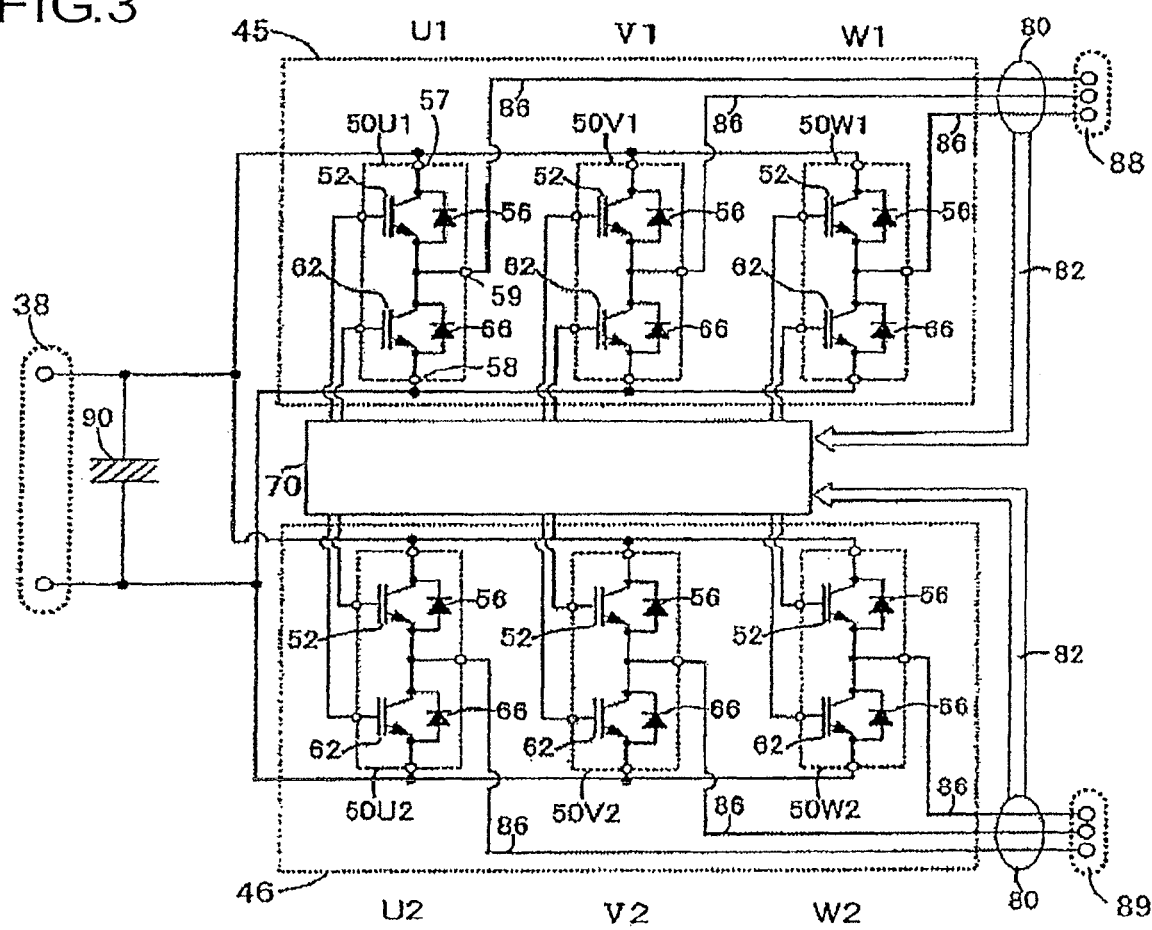
FIG. 3 is a diagram showing circuitry of an electric power conversion apparatus in which two upper and lower arms series circuits are used to output alternating current for each phase to the motor generator.

FIG. 3 is a diagram that shows circuitry of an electric power conversion apparatus in which two upper and lower arms series circuits are provided for each phase as a circuit that generates output of each phase of the three-phase alternate current to be output to the motor generator. When the capacity of the motor generator is increased, electric energy converted by the electric power conversion apparatus increases, and the value of the current that flows in the upper and lower arms series circuit for each phase of the inverter circuit 44 increases. The increase in power to be converted can be coped with by increasing the electrical capacity of the upper and lower arms. However, it is preferred that the quantity of output of inverter circuits (inverter modules) is increased. The configuration shown in FIG. 3 is intended to cope with the increase in the electric energy to be converted by increasing the number of inverter circuits (modules) used that are produced in a standardized fashion.

While the inverter circuit 44 shown in FIG. 2 includes the three upper and lower arms series circuits 50, 50, and 50 so as to form U-phase, V-phase, and W-phase to the motor generator 92, the configuration shown in FIG. 3 includes two parallelly connected inverter circuits, that is, a first inverter circuit 45 and a second inverter circuit 46, which have the same configuration as the inverter circuit 44 shown in FIG. 2 has, so as to cope with the increase in the capacity of the motor generator 92 to be controlled. The configuration shown in FIG. 3 includes upper and lower arms series circuits 50U1 and 50U2 corresponding to the U-phase of the upper and lower arms series circuit 50 shown in FIG. 2, upper and lower arms series circuits 50V1 and 50V2 for the V-phase, and upper and lower arms series circuits 50W1 and 50W2 for the W-phase. It should be noted that alternate current power lines 86 of the first and second inverter circuits shown in FIG. 3 are represented by a first alternate current bus bar 391 and a second alternate current bus bar 392 in the drawings hereinafter.

Figure 4:
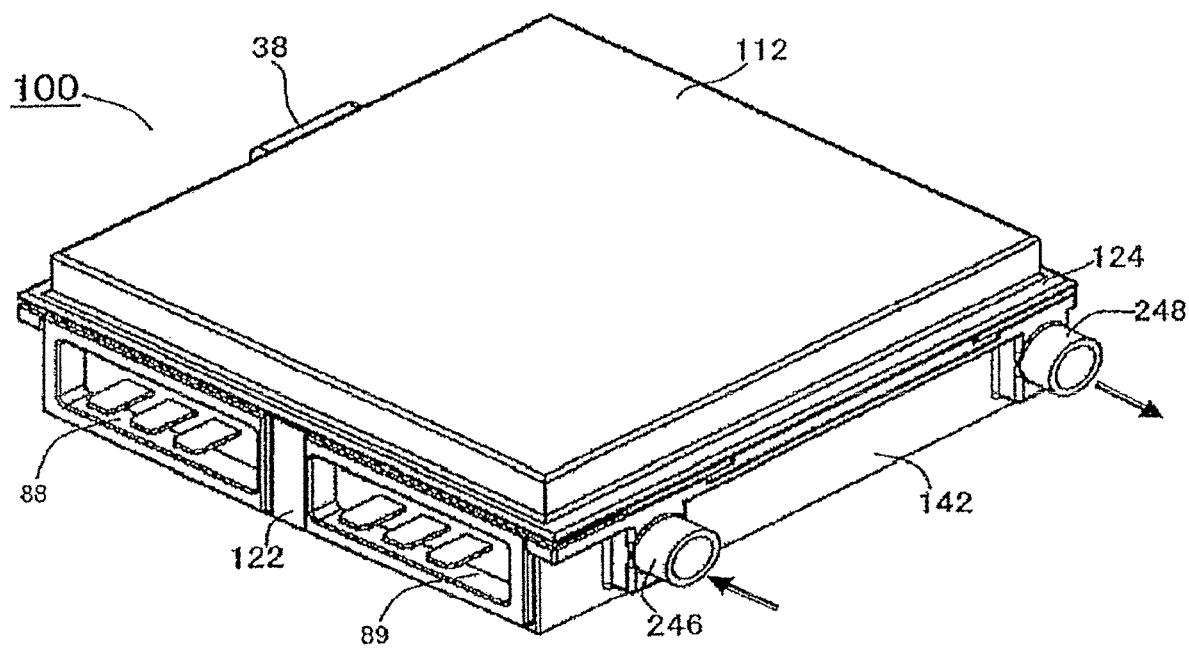
FIG. 4 is a perspective view showing an appearance configuration of the electric power conversion apparatus according to an embodiment of the present invention.
Figure 5:
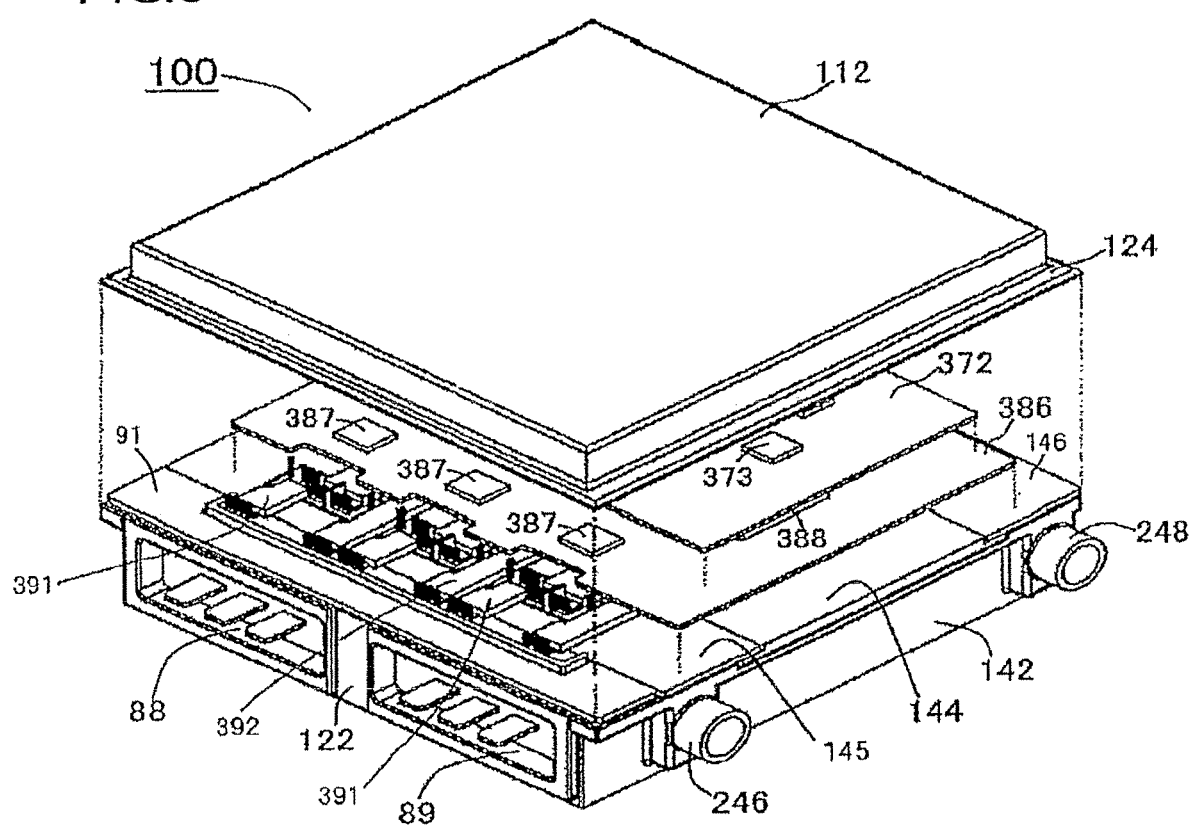
FIG. 5 is an exploded perspective view of the electric power conversion apparatus according to an embodiment of the present invention.
Figure 6:
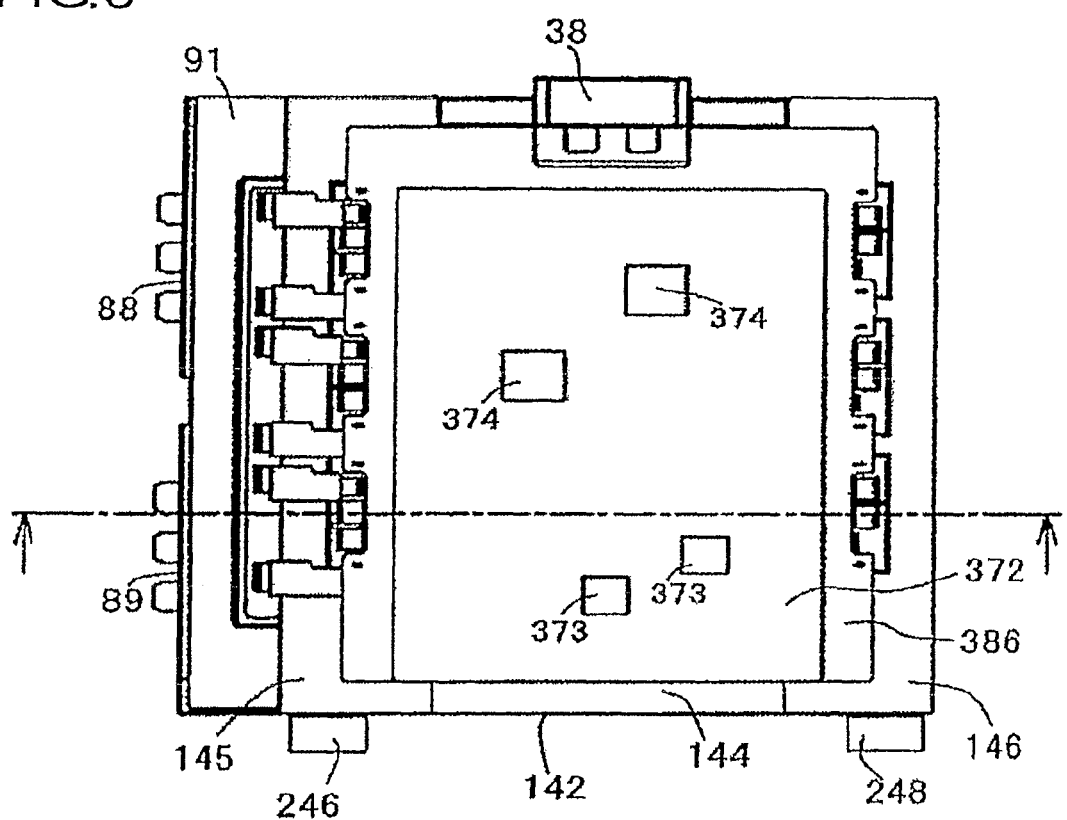
FIG. 6 is a plan view of the electric power conversion apparatus according to an embodiment of the present invention from which an upper case has been removed.

An overall configuration of the electric power conversion apparatus according to the embodiment of the present invention will now be described. FIG. 4 is a perspective view showing an appearance configuration of the electric power conversion apparatus according to the embodiment of the present invention. FIG. 5 is an exploded perspective view of the electric power conversion apparatus according to the embodiment of the present invention. FIG. 6 is a plan view of the electric power conversion apparatus according to the embodiment of the present invention without the upper case.

FIGS. 4 to 6 show a specific example of the electric power conversion apparatus according to the present embodiment with a circuit constituted by the first inverter circuit 45 and the second inverter circuit 46 shown in FIG. 3. Reference numeral 38 designates a direct current connector; 88 designates a first alternate current connector (a connector that is connected to the alternate current power line 86 of the first inverter circuit shown in FIG. 3); 89 designates a second alternate current connector (a connector of the electric power conversion apparatus that is connected to the alternate current power line 86 of the second inverter circuit shown in FIG. 3); 91 designates an alternate current connector flange; 100 designates the electric power conversion apparatus; 112 designates the upper case; 122 designates a positioning member for the alternate current connectors; 124 designates a flange of the upper case; 142 designates a lower case; 144 designates a water channel lid; 145 designates a first module lid; 146 designates a second module lid; 246 designates a water channel inlet; 248 designates a water channel outlet; 372 designates a control board (the control circuit is incorporated therein); 373 designates a first control IC; 374 designates a second control IC; 386 designates a driver board; 387 designates a driver IC; 388 designates a signal connector; 391 designates the first alternate current bus bar (the alternate current power line 86 of the first inverter circuits shown in FIG. 3); and, 392 designates the second alternate current bus bar 2 (the alternate current power line 86 of the second inverter circuits shown in FIG. 3).

For external electrical connection, the electric power conversion apparatus 100 according to the embodiment of the present invention shown in FIGS. 4 to 6 includes the direct current connector 38 that connects with the battery 36 (see FIG. 2), the first alternate current connector 88 and the second alternate current connector 89 that connect with the motor generator 92 (see FIG. 2). An appearance configuration of the electric power conversion apparatus 100 according to the embodiment of the present invention shown in FIGS. 4 to 6 includes the upper case 112, the lower case 142, and the water channel inlet 246 and the water channel outlet 248 through which the cooling water is taken in or out for cooling the semiconductor module including the upper and lower arms series circuit 50 and the capacitor module.

The control board 372 and the driver board 386 are placed one on top of the other (see FIG. 5) between the upper case 112, and the first module lid 145 and the second module lid 146. The first module lid 145 covers each of the semiconductor modules including the upper and lower arms series circuit for each of U1 phase, V1 phase, and W1 phase shown in FIG. 3. The second module lid 146 covers each of the semiconductor modules including the upper and lower arms series circuit for each of U2 phase, V2 phase, and W2 phase shown in FIG. 3. The control board 372 is mounted with the first control IC 373 and the second control IC 374. The driver board 386 is mounted with the driver ICs 387. The first alternate current bus bars 391 and the second alternate current bus bar 392 are provided in a lower part of the driver board 386 for three phases. As described later, the semiconductor module including the upper and lower arms series circuit 50 and the fin is loaded in the horizontally formed water channel space including the water channel inlet 246 and the water channel outlet 248.

Figure 13:
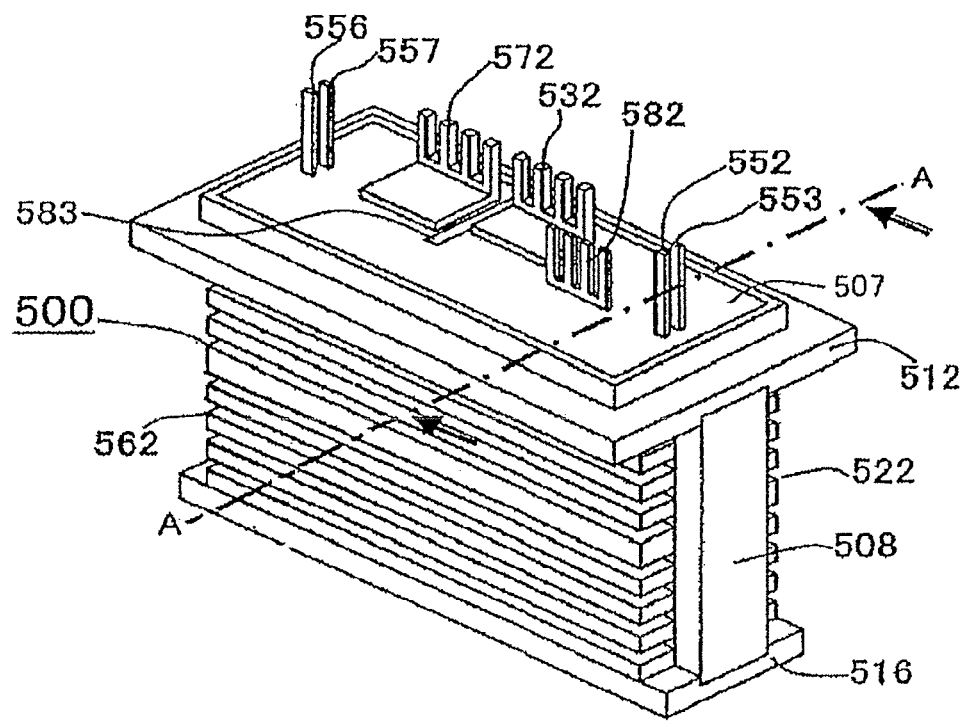
FIG. 13 is a perspective view showing an appearance configuration of the semiconductor module of the electric power conversion apparatus according to an embodiment of the present invention.
Figure 14:
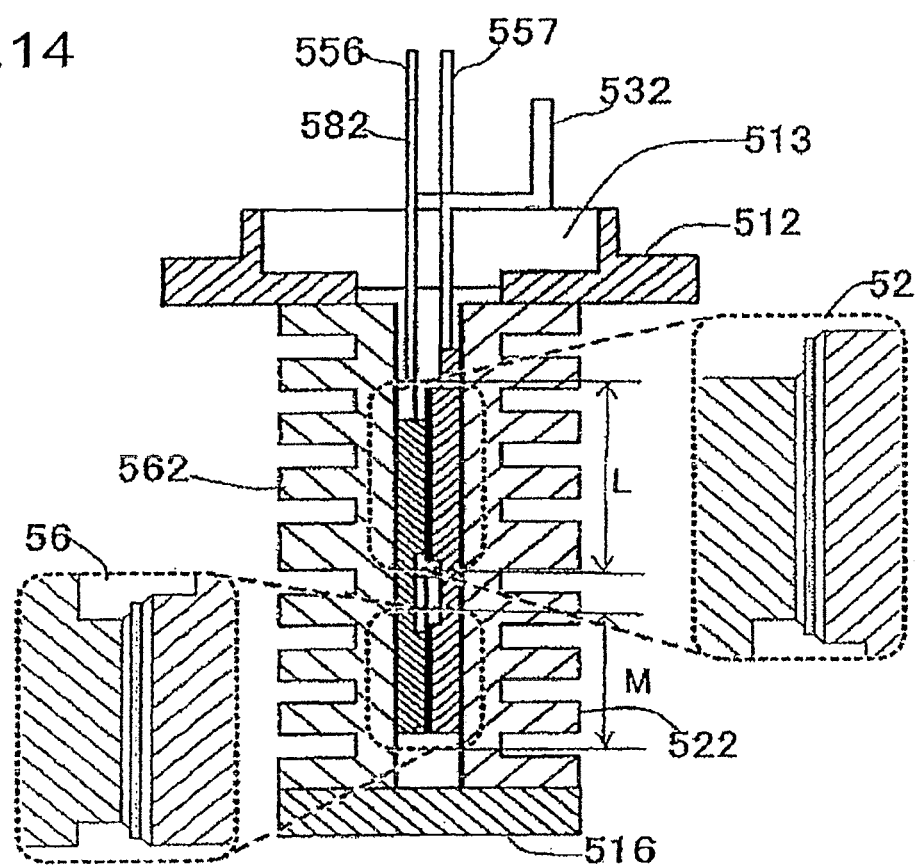
FIG. 14 is a cross-sectional view of the semiconductor module according to the present embodiment as taken through A-A line shown in FIG. 13.
Figure 15:
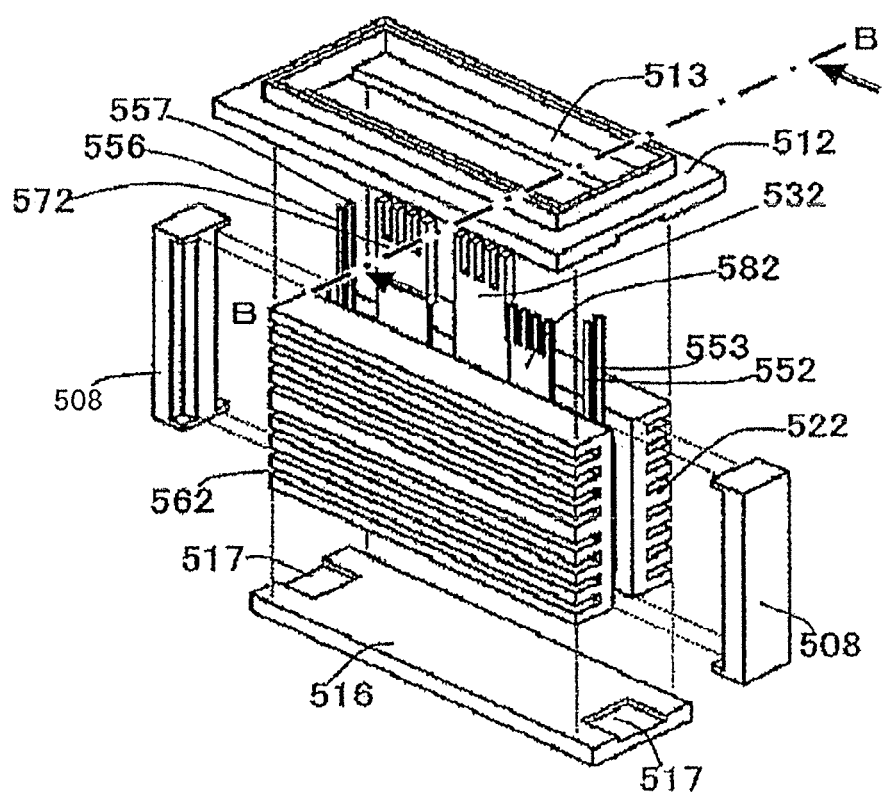
FIG. 15 is an exploded perspective view of the semiconductor module according to the present embodiment.
Figure 16:
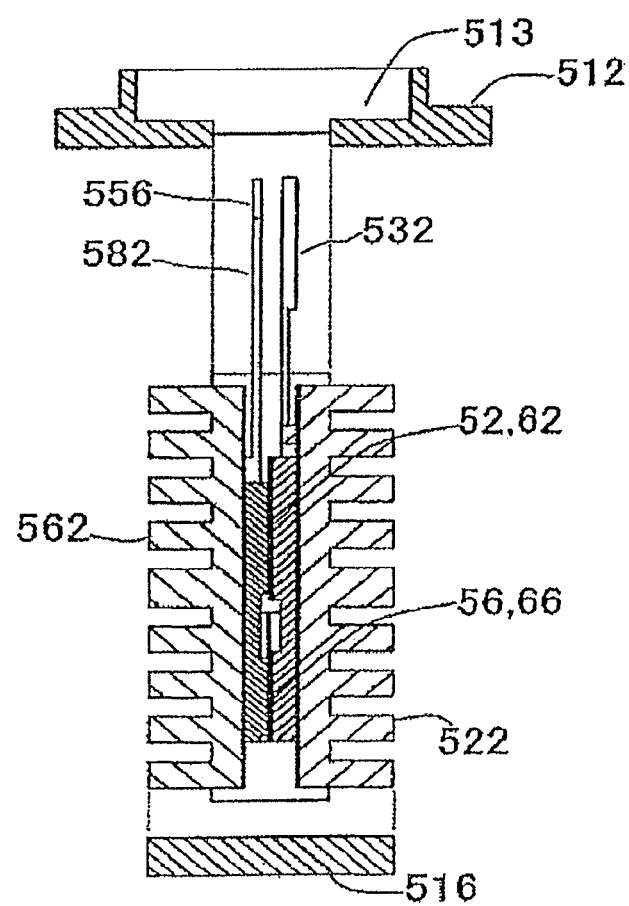
FIG. 16 is a cross-sectional view of the semiconductor module according to the present embodiment as taken through B-B line shown in FIG. 15.

A semiconductor module 500 of the electric power conversion apparatus according to the embodiment of the present invention will now be described with reference to FIGS. 13 to 16. FIG. 13 is a perspective view showing the semiconductor module of the electric power conversion apparatus according to the embodiment of the present invention. FIG. 14 is a sectional view taken through A-A line (shown in FIG. 13) of the semiconductor module according to the present embodiment. FIG. 15 is an exploded perspective view of the semiconductor module according to the present embodiment. FIG. 16 is a sectional view taken through B-B line (shown in FIG. 15) of the semiconductor module according to the present embodiment.

In FIGS. 13 to 16, the semiconductor module 500 of the electric power conversion apparatus according to the embodiment of the present invention includes a n fin 522 on one side (side A) 522, a fin 562 on another side (side B), the upper and lower arms series circuit 50 sandwiched by the fins 522 and 562, various terminals including a positive terminal 532, a negative terminal 572 and an alternate current terminal 582, a top case 512, a bottom case 516, and a side case 508. It is to be noted that a fin refers to not only a fin-shaped part having protrusion and depression but also a heat dissipation metal in whole. As shown in FIGS. 14 and 15, the semiconductor module 500 is obtained as an integrated structure as follows. The upper and lower arms series circuits (whose production method is described later on) are provided on conducting plates that are fixed to the fin (side A) 522 and the fin (side B) 562 through electric insulation sheets, respectively. In a state in which the upper and lower arms series circuits are sandwiched by the fin (side A) 522 and the fin (side B) 562 therebetween, the bottom case 516, the top case 512, and the side case 508 are assembled together. Then a mold resin is filled between the fins 522 and 562 from the side of the top case 512 to obtain an integrated structure.

The semiconductor module 500 has an appearance as shown in FIG. 13. That is, the fin (side A) 522 and the fin (side B) 562 are formed so as to be exposed to or inserted into the cooling water channel. Through the top case 512, there protrude the positive terminal 532 (corresponding to the P terminal 57 in FIGS. 2 and 3), the negative terminal 572 (corresponding to the N terminal 58 in FIGS. 2 and 3), the AC terminal 582 (corresponding to the AC terminal 59 in FIG. 3), the signal terminal 552 (for the upper arm), the gate terminal 553 (for the upper arm), the signal terminal 556 (for the lower arm), and the gate terminal 557 (for the lower arm) of the upper and lower arms series circuit 50.

The appearance configuration of the semiconductor module 500 is substantially rectangular parallelepiped. The fin (side A) 522 and the fin (side B) 562 both have a large area. Assuming that the face of the fin (side B) 562 is a front face and the face of the fin (side A) is a rear face (as shown in FIG. 13), both of the sides, i.e., the side at which the side case 508 is depicted and the side opposite thereto, as well as the bottom face and the top face have areas smaller than that of the above-mentioned front face or the rear face. Since the basic shape of the semiconductor module is substantially rectangular parallelepiped and the fin (side B) 562 and the fin (side A) 522 are rectangular, their cutting work is easy.

In addition, due to its shape, the semiconductor module is less likely to turn over in the production line, achieving excellent productivity. Moreover, a ratio of heat dissipation area to the whole volume can be made large, improving the cooling effect.

In the present embodiment, each of the fin (side A) 522 and the fin (side B) 562 is configured with a metal plate to be used to sandwich the semiconductor chip and hold the conductor in the semiconductor module and the fin that dissipates heat, and the metal plate and the fine are made of a single metal material. This structure is excellent in increasing the heat dissipation efficiency of the semiconductor module. Another structure with slightly less heat dissipation efficiency may also be used: a metal plate to be used to sandwich the semiconductor chip and hold the conductor in the semiconductor module and the fin that dissipates heat may be made separately and affixed together.

On the top face, which is one of smaller faces of the substantially rectangular parallelepiped, there are assembled the positive terminal 532 (corresponding to the P terminal 57 in FIG. 3), the negative terminal 572 (corresponding to the N terminal 58 in FIG. 3), the AC terminal 582 (corresponding to the AC terminal 59 in FIG. 3), the signal terminal 552 (for the upper arm), the gate terminal 553 (for the upper arm), the signal terminal 556 (for the lower arm), and the gate terminal 557 (for the lower arm). This structure is excellent in easily inserting the semiconductor module 500 into the water channel case. A hole 583 is provided between the positive terminal 532 and the negative terminal 572 to assure insulation therebetween. More specifically, the hole 583 is formed in a mold resin 507 between the positive terminal 532 and the negative terminal 572. As described later, a terminal insulation part attached to the capacitor module which is provided between the positive terminal and the negative terminal of the capacitor module 390 is inserted into the hole 583 (see FIG. 21). The hole 583 thus functions both as insulation between the terminals and as positioning.

The area of the top face on which the above-mentioned terminals are provided is made larger than the area of the bottom face, as shown in FIG. 13, so as to protect the terminal parts that otherwise tend to be damaged as the semiconductor module is moved on the production line or the like. That is, the area of the top case 512 is made larger than the area of the bottom case 516, so as to provide excellent sealability of the opening of the cooling water channel which is to be described hereinbelow, as well as to protect the terminals of the semiconductor module when the semiconductor module is produced, transported, and attached to the channel case.

With the arrange of the terminals shown in FIG. 13, the positive terminal 532 and the negative terminal 572 each have a plate-like rectangular cross-section and a comb-like tip. The positive terminal 532 and the negative terminal 572 are arranged right and left at equal spaces seen from the fin (side B) 562, and arranged close to one side of the semiconductor module. As shown in FIGS. 13 and 14, the terminals 532 and 572 each include the conductor plate of the arm that extends in a vertical direction (set up vertically) and thereafter extends in a horizontal direction (bent at a right angle) up to the comb-like tip. In other words, the positive terminal 532 and the negative terminal 572 include bends and the comb-like tips are arranged along the fin 522 (side A). While the terminals 532 and 572 shown in FIGS. 13 and 14 include the bends, the terminals 532 and 572 shown in FIGS. 15 to 20 do not include the bends and are straight. This is because FIG. 13 shows the terminals after being bent while FIGS. 15 to 20 show the terminals before being bent. The terminals are bent after process of soldering, inner molding, and case adhering (joining) so that a force is not applied on the inside semiconductor and the soldering part at the time of the bending. Additionally, assembly of the top case 512 becomes difficult after terminals are bent.

As described in detail later, since the capacitor module 390 is arranged facing the fin (side B) 562, the positive electrode terminal and the negative electrode terminal of the capacitor module are connected with the positive electrode terminal 532 and the negative electrode terminal 572 of the semiconductor module through DC bus bars of equal length to each other, respectively. This makes wiring easy. Connecting ends of the positive electrode terminal 532 and the negative electrode terminal 572 are each arranged with a shift from a connecting end of the AC terminal 582 in the front and rear direction of the semiconductor module (direction connecting both sides of the semiconductor module to each other). This ensures a space for using a tool for connecting the connecting ends of the positive electrode terminal 532 and of the negative electrode terminal 572 to other components as well as for connecting the connecting end of the AC terminal 582 to other components, achieving excellent productivity.

There is a possibility that an electric power conversion apparatus for an automobile is cooled down to −30° C. or lower, even as low as around −40° C. On the other hand, there is a possibility that the temperature of the electric power conversion apparatus reaches 100° C. or higher, infrequently as high as around 150° C. As mentioned above, the electric power conversion apparatus to be mounted on an automobile is used at temperatures in a wide range and hence it is necessary to give due considerations to changes due to thermal expansion. The electric power conversion apparatus is also used in an environment in which vibration is always applied thereto. The semiconductor module 500 described with reference to FIGS. 13 to 16 has a structure in which the semiconductor chip is sandwiched by two heat dissipation metals. According to this embodiment, a metal plate having fins with excellent heat dissipation function is used as an example of a heat dissipation metal. This is described in the present embodiment as the fin 522 (side A) and the fin 562 (side B).

In the above-mentioned structure of sandwiching the semiconductor chip, both sides of the two heat dissipation metals are fixed with the top case 512 and the bottom case 516. In particular, the top case 512 and the bottom case 516 each sandwich the two heat dissipation metals from the outer sides thereof. Specifically, it is only necessary to fit protrusions of the two heat dissipation metals 522 and 562 in fitting parts 517 of the bottom case 516. It is only necessary to apply the same fitting structure to the top case 512. This structure prevents a large force from generating in the direction in which the two heat dissipation metals move away from each other due to vibration and thermal expansion, thereby achieving a highly reliable electric power conversion apparatus without malfunction even through a long-term use mounted on an automobile.

In the present embodiment, a structure is adopted in which the top case 512 and the bottom case 516 sandwich the above-mentioned two heat dissipation metals as well as the side cases so as to enclose the heat dissipation metals and fix them from the outer circumferential sides. Accordingly, the reliability of the electric power conversion apparatus is further increased.

The positive electrode terminal 532, the negative electrode terminal 572, the AC terminal 582, the signal terminals 552 and 556, and the gate terminals 553 and 557 of the semiconductor module are configured to protrude to outside through an opening in the top case 512, which is one of the cases. The opening is sealed with the mold resin 507. The top case 512 is made of a material having high strength, for example, a metal, which has the thermal expansion coefficient close to that of the two heat dissipation metals. The mold resin 507 absorbs stress generated by thermal expansion of the case 512 and reduces the stress applied to the above-mentioned terminals. Therefore, the electric power conversion apparatus according to the present embodiment can be used in an environment with severe temperature changes or with constant vibration applied thereto. High reliability is thus assured.

Figure 17:
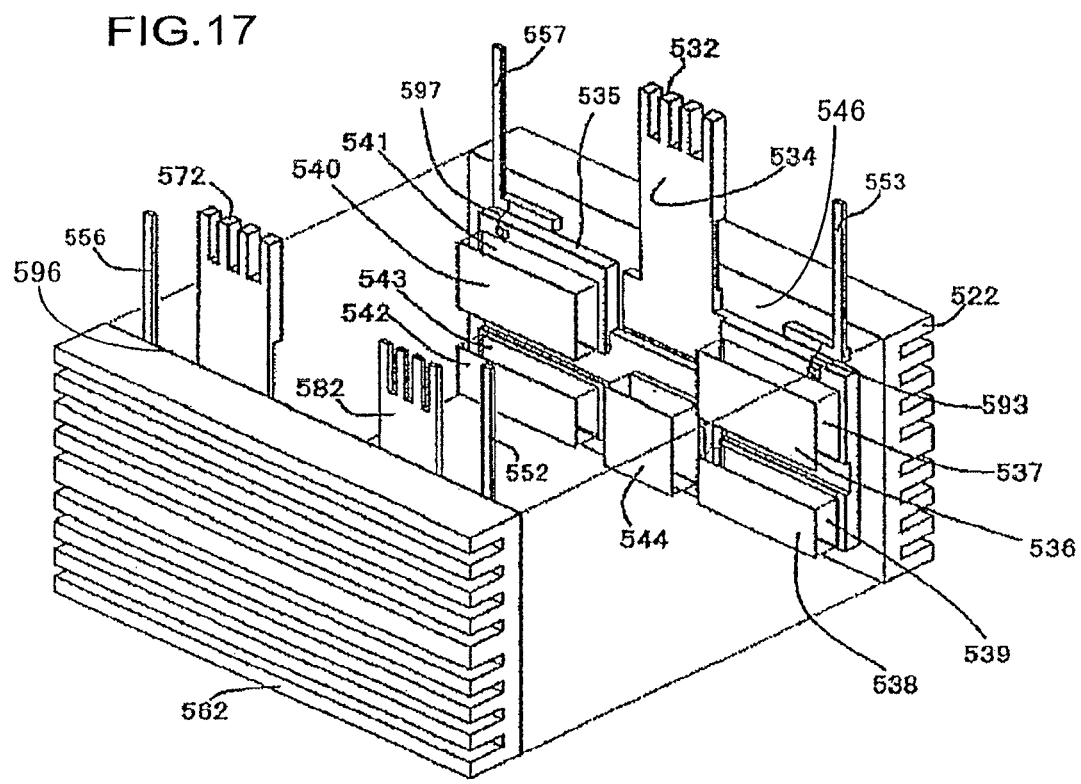
FIG. 17 is a perspective view showing an inside structure of an upper and lower arms series circuit of the semiconductor module according to the present embodiment.

FIG. 17 is an exploded diagram showing a perspective view of the internal configuration of an upper and lower arms series circuit of the semiconductor module according to the present embodiment. The semiconductor module according to the present embodiment shown in FIG. 17 is produced in the following order. Plates of heat dissipation metal, for example, the fin (side A) 522 and the fin (side B) 562, which are metal plates with fin structure, are used as basis materials, and an electric insulation sheet (side A) 546 and an electric insulation sheet (side B) 596 are fixed to the inner sides of the metal plates, respectively, by vacuum thermocompression. A conducting plate 534 on the positive electrode side and an upper and lower arms connection conducting plate 535 are fixed to the electric insulation sheet (side A) 546 (see FIG. 19). A conducting plate 574 on the negative electrode side and a conducting plate 584 on the AC terminal side are fixed to the electric insulation sheet (side B) 596. The signal terminal 556 for the lower arm is connected to the conducting plate 574 on the negative electrode side. The signal terminal 552 for the upper arm is connected to the conducting plate 584 on the AC terminal side (see FIG. 20).

The electric insulation sheet (side A) 546 and the electric insulation sheet (side B) 596 are explained below. They function as insulation members that electrically insulate the semiconductor chip and conductors constituting the upper and lower arms series circuit of the inverter circuit from the fin (side A) 522 and the fin (side B) 562. They also serve to form a heat conducting path that conducts heat generated by the semiconductor chip and so on to the fin (side A) 522 and the fin (side B) 562. The insulation member may be an electric insulation sheet or plate made of a resin or may be a ceramic board. For example, the insulation member of a ceramic board is preferably 350 μm thick or thinner. The insulation member of an electric insulation sheet is even thinner, preferably between 50 μm to 200 μm thick. It should be noted that a thinner insulation member is more effective for reducing inductance, therefore an electric insulation sheet made of a resin has more excellent characteristics than a ceramic board has.

An upper arm IGBT chip 537 and an upper arm diode chip 539 are arranged along a vertical direction and soldered on to the conducting plate 534 of the positive electrode side on the fin (side A) 522. Similarly, a lower arm IGBT chip 541 and a lower arm diode chip 543 are arranged along a vertical direction and soldered on to the upper and lower arms connection conducting plate 535 on the fin (side A) 522. The size of the IGBT chip measured along the vertical direction is substantially larger than that of the diode chip. Assuming that a water channel occupancy represents a proportion that an IGBT chip and a diode chip occupy to the cooling water flowing through the fin 522, a water channel occupancy of the upper arm IGBT chip 537 is larger than that of the upper arm diode chip 539. This facilitates heat dissipation of the IGBT chip, whose heat dissipation amount is larger than that of the diode chip, thereby improving cooling efficiency of the overall semiconductor module. The cooling efficiency of the lower arm chips 541 and 543 is improved similarly to that of the upper arm chips.

Figure 18:
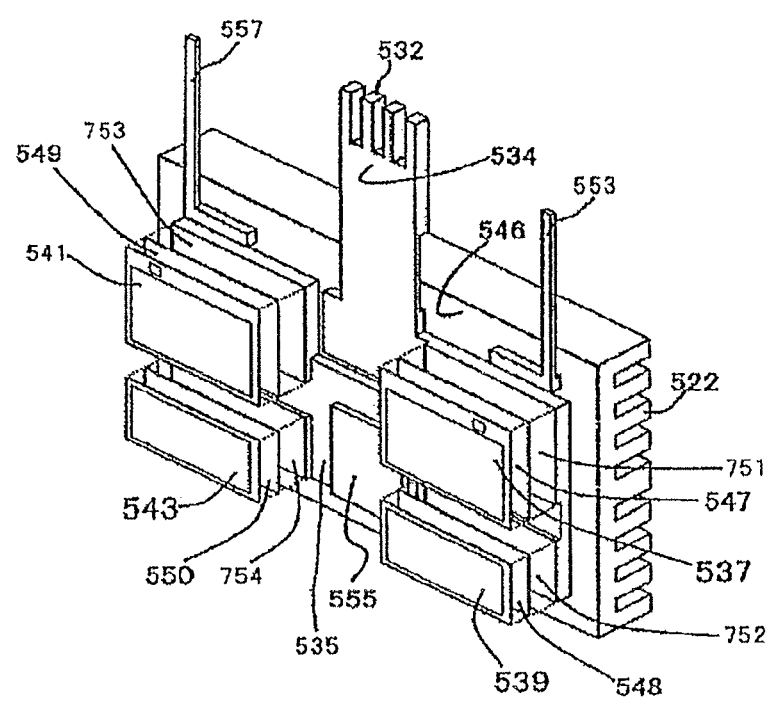
FIG. 18 is a perspective view showing the configuration of the upper and lower arms series circuit disposed in a fin (side A) of the semiconductor module according to the present embodiment.
Figure 19:
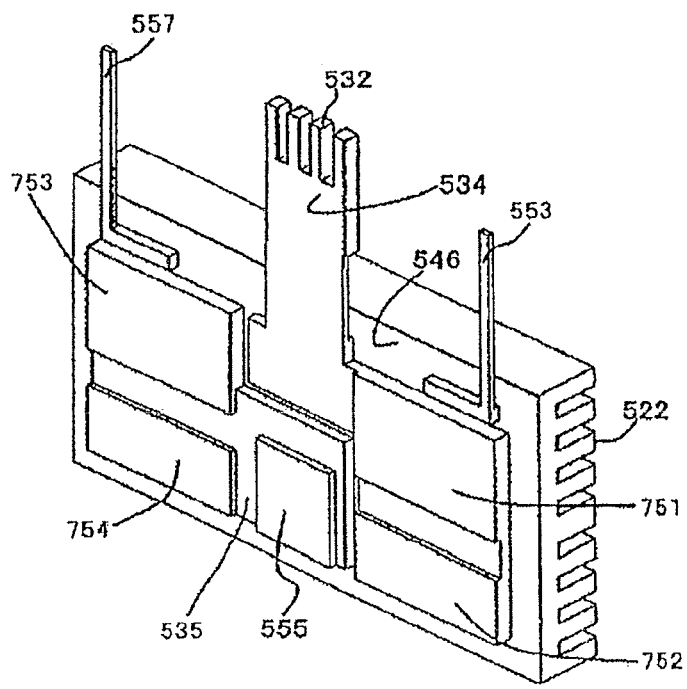
FIG. 19 is a perspective view of components disposed in the fin (side A) of the semiconductor module.
Figure 20:
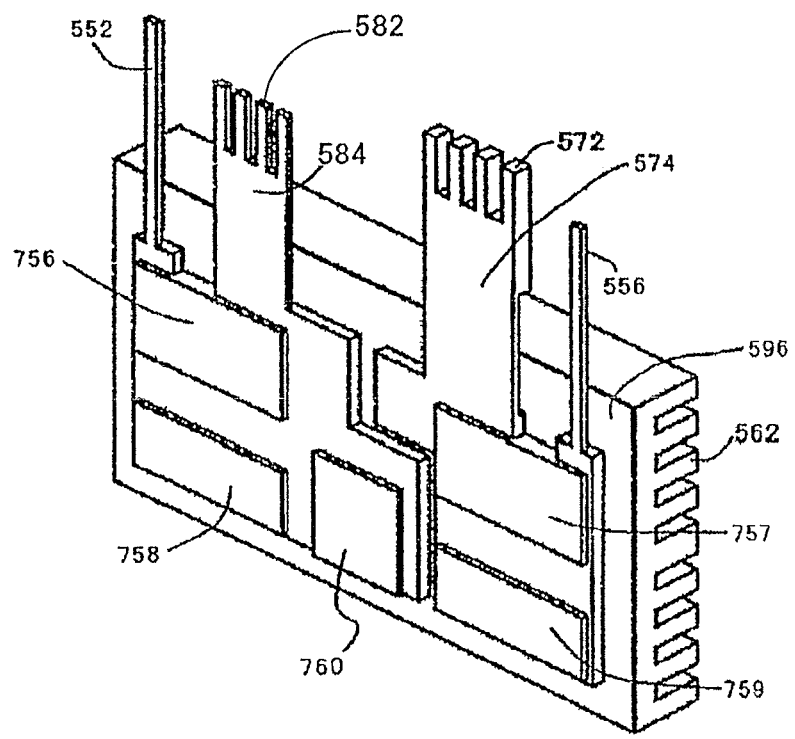
FIG. 20 is a perspective view of components disposed in the fin (side B) of the semiconductor module.

As further detailed in FIGS. 18 to 20, an upper and lower arms connection soldered portion 555, which connects the emitter of the upper arm with the collector of the lower arm, similar to the lower arm chips 541 and 543, is formed on a conducting plate 535 of the fin (side A) 522 (see FIGS. 18 and 19). The soldered portion 555 is connected with the AC terminal 582 (corresponding to the AC terminal 59 in FIG. 3) through a solder layer 544 and the conducting plate 584, constituting the intermediate electrode 69 (see FIG. 2) of the upper and lower arms series circuit. Wire bondings 593 and 597 respectively connect between the gate electrode of the IGBT 537 of the upper arm and a signal conductor of the gate terminal (for the upper arm) 553 and between the gate electrode of the IGBT 541 of the lower arm and a gate conductor of the gate terminal (for the lower arm) 557, soldered on the conducting plates on the fin (side A) 522.

On the other hand, as shown in FIGS. 17 and 20, the electric insulation sheet (side B) 596 of the fin (side B) 562 is fixed with the conducting plate 574 on the negative electrode side of the negative terminal 572, the conducting plate 584 on the AC terminal side of the AC terminal 582, and the conducting plates of each of the signal terminal (for the upper arm) 552 and the signal terminal (for the lower arm) 556. The conducting plate 574 on the negative electrode side is provided with a soldered portion 757 to which the emitter side of the lower arm IGBT chip 541 is connected and a soldered portion 759 to which the anode side of the lower arm diode chip 543 is connected. The conducting plate 584 on the AC terminal side is provided with a soldered portion 756 to which the emitter side of the upper arm IGBT chip 537 is connected and a soldered portion 758 to which the anode side of the upper arm diode chip 539 is connected. The negative terminal 572 (corresponding to the negative terminal 58 in FIG. 2) is connected and fixed to the lower arm IGBT chip 541 and the lower arm diode chip 543 through the conducting plate 574, the soldered portions 757 and 759, and solder layers 540 and 542. The positive terminal 532 is connected and fixed to the upper arm IGBT chip 537 and the upper arm diode chip 539 through the conducting plate 534, soldered portions 751 and 752, and solder layers 536 and 538. The AC terminal 582 is connected and fixed to the lower arm IGBT chip 541 through the conducting plate 584, an upper and lower arms connection soldered portion 760 connecting to the emitter side of the upper arm IGBT chip, the solder layer 544, the upper and lower arms connection soldered portion 555, and the conducting plate 535. Each of the conducting plates of the upper arm signal terminal 552 (corresponding to the signal terminal 55 shown in FIG. 2) and the lower arm signal terminal 556 (corresponding to the signal terminal 65 shown in FIG. 2) is connected to the emitter side of each of the upper arm IGBT chip 537 and the lower arm IGBT chip 541. The above-mentioned arrangement for the semiconductor module constitutes the circuitry of the upper and lower arms series circuit 50 shown in FIG. 2.

As shown in FIG. 17, a set of the semiconductor chips for the upper arm and a set of the semiconductor chips for the lower arm are each arranged along the vertical direction and fixed to the fin (side A) 522, which is one of the fins. The fin (side A) 522 is provided with the upper arm gate terminal 553 and the lower arm gate terminal 557. This enables connecting operation such as wire bonding to be completed intensively in the production process of one of the fins, i.e., the fin (side A) 522, thereby improving productivity and reliability. Since the semiconductor chip to be wired and the terminal are fixed to the same fin, better vibration resistance is obtained when the electric power conversion apparatus is used in an environment with large vibration such as an automobile.

As described above, the fin (side A) 522 and the fin (side B) 562 are placed facing each other as shown in FIG. 17. The electrodes of the IGBT chips 537 and 541 and the diode chips 539 and 543 of the fin (side A) 522 are each faced and soldered to the conducting plates each connecting to the negative terminal 572, the AC terminal 582, the signal terminal 552 for the upper arm, and the signal terminal 556 for the lower arm of the fin (side B) 562 so as to achieve the circuitry as shown in FIG. 2. As FIG. 15 shows, the bottom case 516, the top case 512, and the side cases 508 are bonded with an adhesive to the fin (side A) 522 and the fin (side B) 562 constituting an integrated structure. The mold resin is filled through the opening 513 (see FIG. 15) in the top case into the inside to form the semiconductor module 500.

The production method and structure of the upper and lower arms series circuit (for example, 2 arms in 1 module structure) sandwiched between both the fins 522 and 562 of the semiconductor module 500 according to the present embodiment will now be described with reference to FIGS. 18 to 20. FIG. 18 is a perspective view of the upper and lower arms series circuit that is disposed in a fin (side A) of the semiconductor module according to the present embodiment. FIG. 19 is a perspective view illustrating the connection of components to be disposed in the fin (side A) of the semiconductor module. FIG. 20 is a perspective view illustrating the connection of components to be disposed in a fin (side B) of the semiconductor module.

The basic process for producing the semiconductor module according to the present embodiment will now be described in order. Plates of heat dissipation metal, for example, the fin (side A) 522 and the fin (side B) 562, which are metal plates with a fin structure in the present embodiment, are used as base materials, and the electric insulation sheet (side A) 546 and the electric insulation sheet (side B) 596 are fixed to the inner sides thereof by vacuum thermocompression. The conducting plate 534 and the conducting plate 535 on the positive electrode side are fixed to the electric insulation sheet 546 (side A). The conducting plate 574 and the conducting plate 584 for AC terminal on the negative electrode side are fixed to the electric insulation sheet 596 (side B). FIG. 19 shows the fixing of the conducting plates 534 and 535 to the fin (side A) 522 and the electric insulation sheet (side A) 546. FIG. 20 shows the fixing of the conducting plates 574 and 584 to the fin (side B) 562 and the electric insulation sheet (side B) 596.

The electric insulation sheet 546 (side A) is fixed with a gate conductor of the gate terminal (for the upper arm) 553 and a gate conductor of the gate terminal (for the lower arm) 557. The electric insulation sheet 596 (side B) is fixed with a signal conductor of the signal terminal (for the upper arm) 552 and a signal conductor of the signal terminal (for the lower arm) 556. The layout of these is as shown in FIGS. 19 and 20.

The IGBT chip 537 (for the upper arm), the diode chip 539 (for the upper arm), the IGBT chip 541 (for the lower arm), and the diode chip 543 (for the lower arm) are respectively soldered on to the soldered portions 751, 752, 753, and 754 provided on the conducting plate 534 and the upper and lower arms connection conducting plate 535 on the positive electrode side of the fin (side A) 522 through the solder layers 547, 548, 549, and 550. On this occasion, the conducting plate 534 and the conducting plate 535 are provided as insulated from each other, and a pair of the IGBT chip and the diode chip are soldered to each of the conducting plates 534 and 535. The soldered portion 555 that connects the emitter of the upper arm with the collector of the lower arm as shown in FIG. 2, is soldered to the conducting plate 535 in the same manner as the chips 541 and 543. The soldered portion 555 for the upper and lower arms connection (see FIG. 19) abuts against and is connected to the conducting plate 584 for the AC terminal through the upper and lower arms connection soldering part 760 (see FIG. 20) so as to constitute the intermediate electrode 69 (see FIG. 2).

The gate wire (for the upper arm) 593 is used for bonding connection between the gate electrode of the IGBT 537 of the upper arm soldered on the conducting plate 534 of the fin (side A) 522 and the gate conductor of the gate terminal (for the upper arm) 553 (see FIG. 17). Likewise, the gate wire (for the lower arm) 597 is used for bonding connection between the gate electrode of the IGBT 541 of the lower arm soldered on the conducting plate 535 of the fin (side A) 522 and the gate conductor of the gate terminal (for the lower arm) 557 (see FIG. 17).

As shown in FIG. 18, the semiconductor chips for the upper arm and the semiconductor chips for the lower arm are fixed to the fin (side A) 522, which is one of the fins. The semiconductor chips are provided with the gate conductors that are connected to the gate terminals 553 and 557 that control signals. The semiconductor chips for the upper and the lower arms and control lines therefor are thus fixed on one of the insulation members. This results in intensive production process for connecting signal lines with the semiconductor chips, such as wire bonding. This also results in improvement in productivity and reliability. Both of the semiconductor chip to be wired and the control line for wiring are fixed to a single member, that is, one of the fins. Therefore, better vibration resistance is obtained when the electric power conversion apparatus is used in an environment with large vibration such as an automobile.

As shown in FIG. 19, the semiconductor chip 537 (to be connected to the soldered portion 751) for the upper arm and the semiconductor chip 541 (to be connected to the soldered portion 753) for the lower arm are provided so as to face toward the same direction. That is, the respective collector surfaces of the semiconductor chips are provided to face the electric insulation sheet 546, which is an insulating member. The soldered portions 751 and 753 are provided to face the collector sides of the IGBT chips 537 and 541. This alignment of the direction of the semiconductor chips of the upper and the lower arms improves workability. This is true also for the diode chips 539 and 543.

As shown in FIG. 14, also referring to FIG. 17, the IGBT 52 of the upper arm is provided above the diode 56 of the upper arm in the upper and lower arms series circuit 50 incorporated in the semiconductor module 500 according to the present embodiment. This configuration is true for the IGBT and diode in the lower arm. As detailed later, the semiconductor module 500 shown in FIG. 13 is inserted into the cooling water channel from above so that the cooling water flowing in the cooling water channel cools the semiconductor module 500. More specifically, the cooling water flows through the comb-like parts (concave, depression part) of the fin (side A) 522 and the fin (side B) 562.

The length L of the IGBT 52 is larger than the length M of the diode 56 in, for example, the upper arm (L>M). Cooling effect of the cooling water flowing through the comb-like parts of the fins depends on the lengths L and M. In other words, the amount of the cooling water corresponds to the lengths L and M. Therefore, the amount of cooling water used for cooling the IGBT, whose heat should be dissipated more than that of the diode, is larger than that for the diode, improving the cooling efficiency.

The semiconductor module 500 with the integrated structure shown in FIG. 13 includes the positive terminal 532 and the negative terminal 572 that protrude upwards, which are to be connected to the positive electrode side and the negative electrode side of the capacitor 90. The terminals 532 and 572 are arranged on a straight line along the cooling water channel (along the long side of the rectangle of the cross-section of the semiconductor module seen from above). As described in detail later, a plurality of semiconductor modules are provided on the both sides of the capacitor module so that the long side of the rectangle of the cross-section of each of the semiconductor modules are substantially aligned if seen from above (along the flow of the cooling water). In other words, the plurality of semiconductor modules sandwich the capacitor module (see FIG. 11).

In the arrangement of the semiconductor modules and the capacitor module described above, the terminals on the positive and negative sides of the capacitor module are arranged so as to face respectively the positive terminal 532 and the negative terminal 572 of the semiconductor module shown in FIG. 13. This enables bars identical in shape and in length to be used on both the positive and negative sides for connecting the semiconductor module 500 with the capacitor module 390. This results in improvement in workability and reduction in inductance which results from the switching action of the IGBTs.

Figure 7:
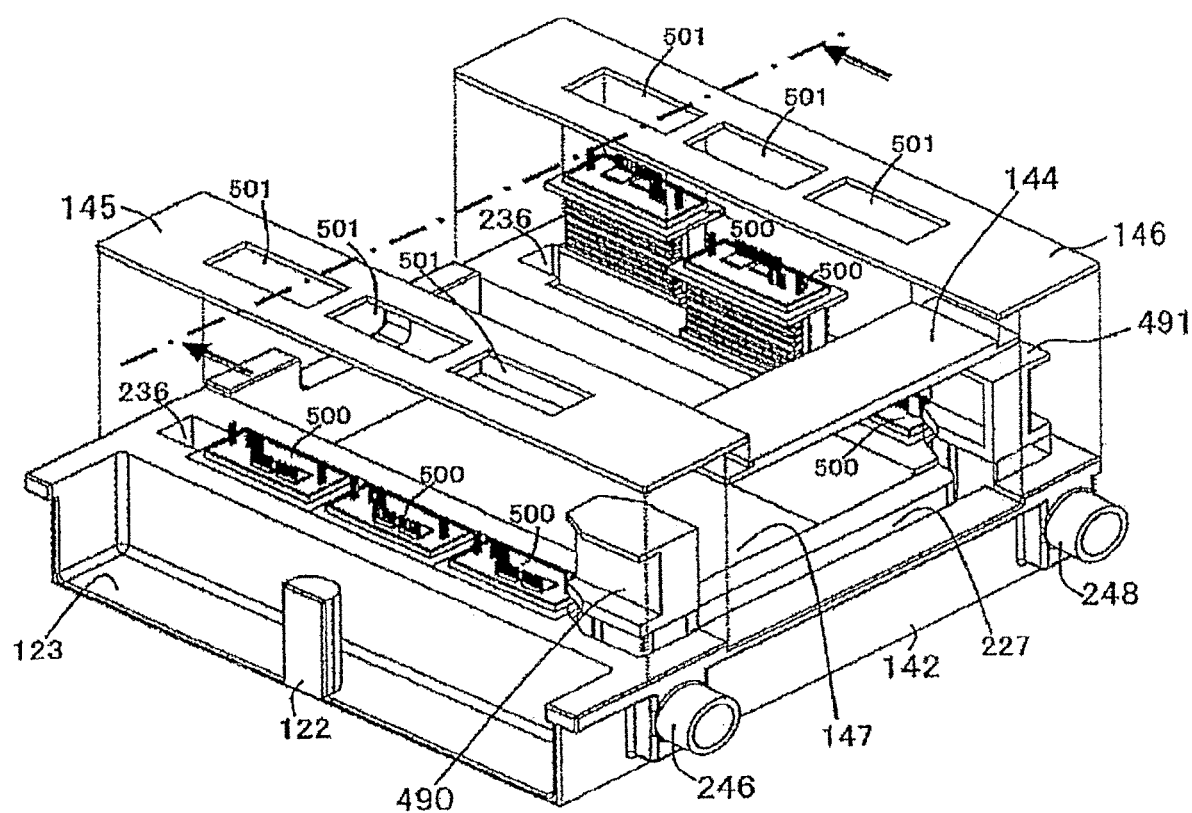
FIG. 7 is an exploded perspective view of the electric power conversion apparatus according to an embodiment of the present invention, showing the electric power conversion apparatus as shown in FIG. 5 from which the upper case, the control board, the driver board, and the alternate current connectors are omitted so as to illustrate the configuration of a semiconductor module.
Figure 8:
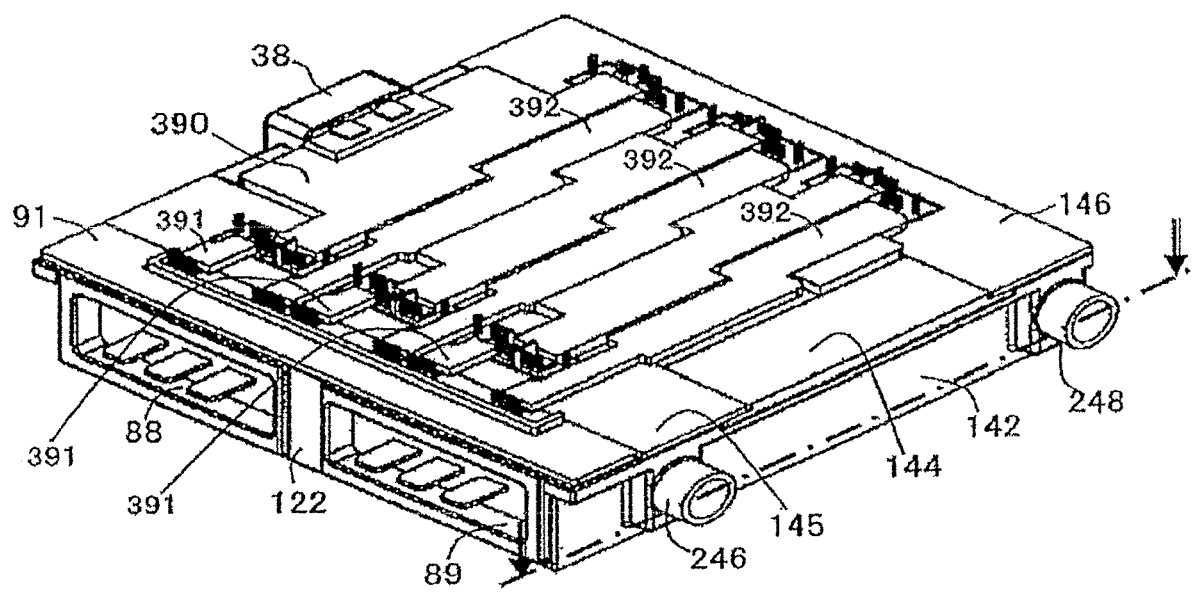
FIG. 8 is a perspective view of the power system of the semiconductor module shown in FIG. 7 with alternate current connectors and a direct current connector added thereto.
Figure 9:
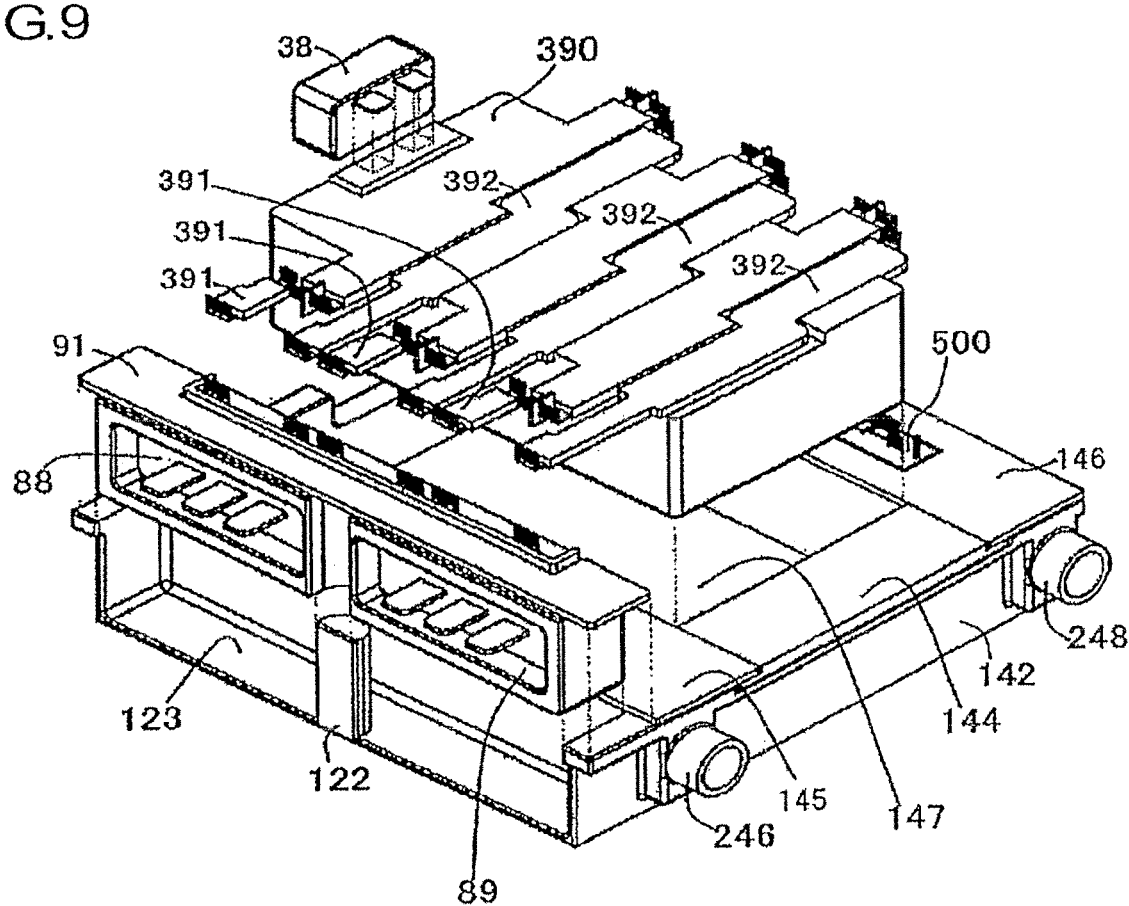
FIG. 9 is an exploded perspective view of the power system of the semiconductor module shown in FIG. 8.
Figure 10:
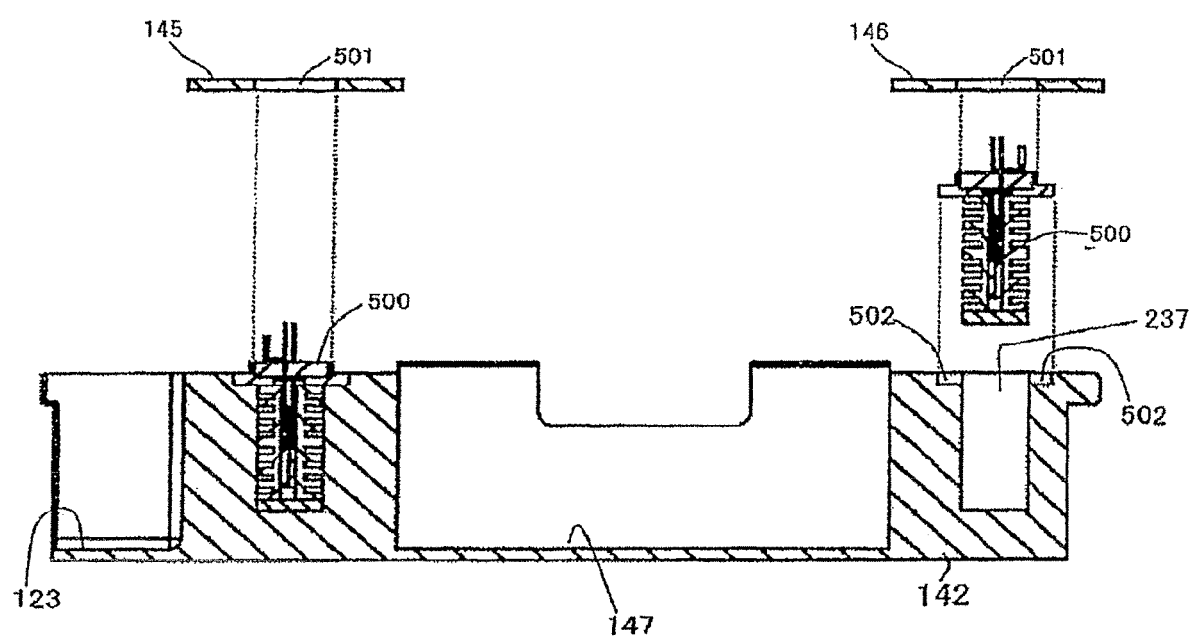
FIG. 10 is an exploded cross-sectional view showing the configuration of the semiconductor module shown in FIG. 7 as seen from the direction of flow of the cooling water.
Figure 11:
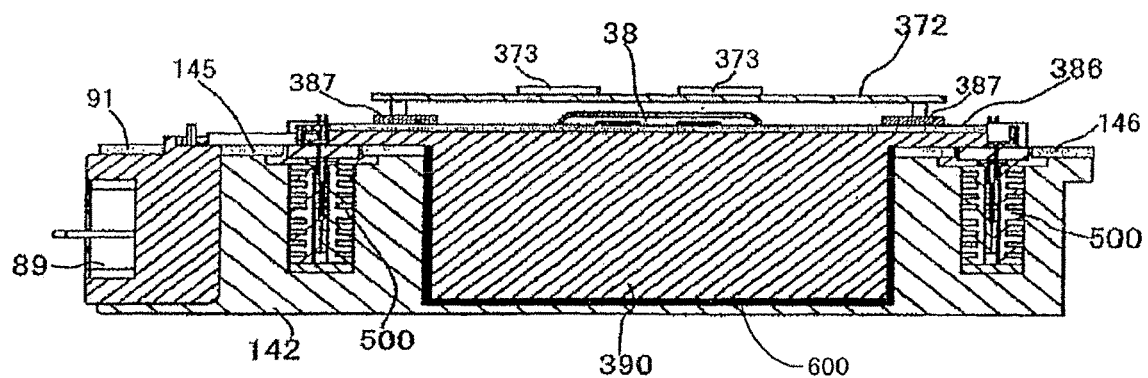
FIG. 11 is a cross-sectional view of the electric power conversion apparatus according to the present embodiment from which the upper case has been removed as seen from the direction of flow of the cooling water.
Figure 12:
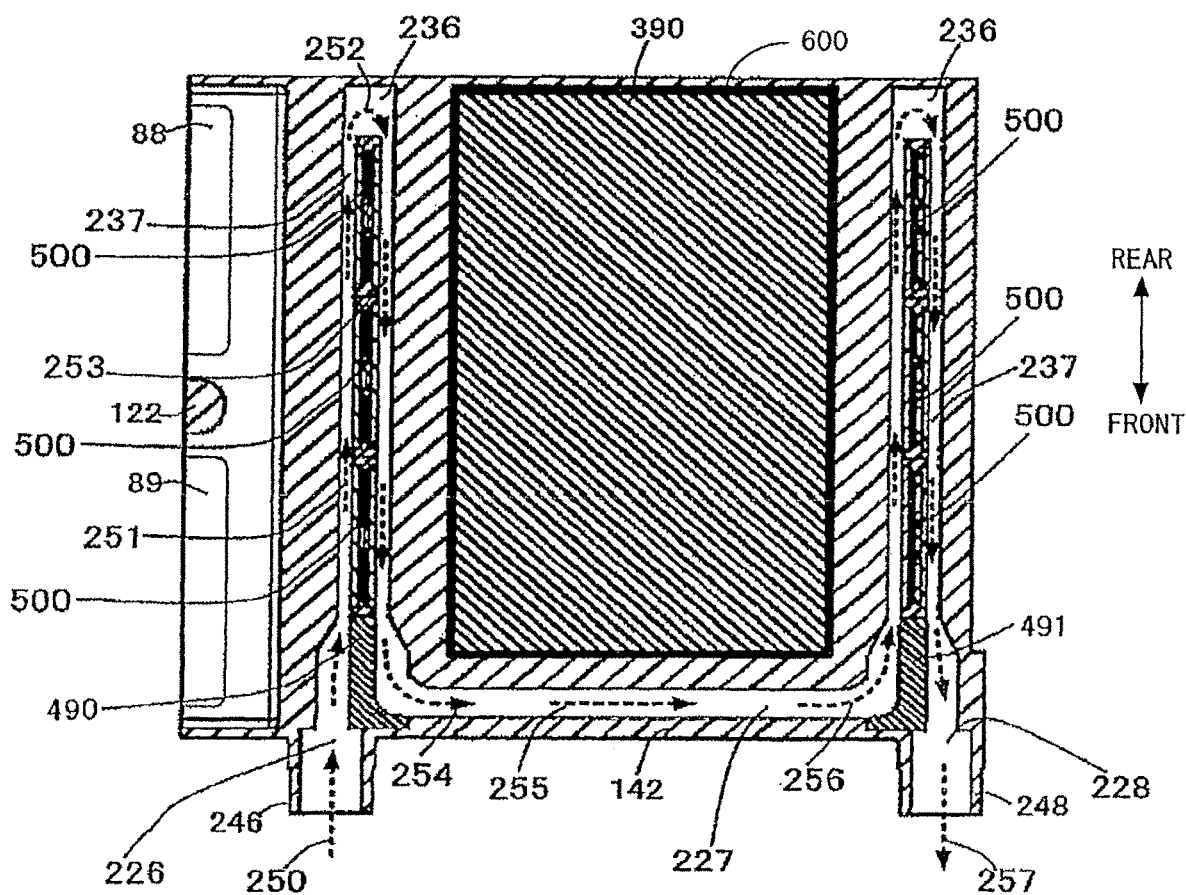
FIG. 12 is a cross-sectional view of the semiconductor module, the capacitor module, and the cooling water channel according to the present embodiment as seen from above.

A specific configuration for improvement in miniaturization, cooling efficiency, and assemblability in the electric power conversion apparatus according to the embodiment of the present invention will now be described with reference to FIGS. 7 to 12. FIG. 7 is an exploded perspective view illustrating the arrangement of the semiconductor modules of the electric power conversion apparatus according to the embodiment of the present invention, showing the same electric power conversion apparatus as that shown in FIG. 5 except for the upper case, the control board, the driver board, and the AC connectors, which have been removed therefrom. FIG. 8 is a perspective view of an electric system of the semiconductor module shown in FIG. 7 with alternate current connectors and a direct current connector added thereto. FIG. 9 is an exploded perspective view of the power system of the semiconductor module shown in FIG. 8. FIG. 10 is an exploded cross-sectional view showing the configuration of the semiconductor module shown in FIG. 7 as seen from the direction of flow of the cooling water. FIG. 11 is cross-sectional view of the electric power conversion apparatus according to the present embodiment from which the upper case has been removed as seen from the direction of flow of the cooling water. FIG. 12 is a cross-sectional view of the semiconductor module, the capacitor module, and the cooling water channel according to the present embodiment as seen from above.

Now, arrangement of the semiconductor module, the cooling water channel, and the electric system of the electric power conversion apparatus according to the present embodiment will first be described with reference to FIGS. 7 to 9. FIGS. 7 to 9 show examples of the structure of six semiconductor modules of two systems: A first semiconductor module incorporated therein the upper and lower arms series circuits of an upper side for U1-phase, V1-phase, and W1-phase as shown in FIG. 3, and a second semiconductor module incorporated therein the upper and lower arms series circuits of a lower side for U2-phase, V2-phase, and W2-phase. The first semiconductor module is connected to the first alternate current connector 88 through three first alternate current bus bars 391. Similarly, the second semiconductor module is connected to the second alternate current connector 89 through three second alternate current bus bars 392. In the drawings, the first semiconductor module incorporated therein the upper and lower arms series circuits of the upper side for U1-phase, V1-phase, and W1-phase as shown in FIG. 3 is provided on the side of the cooling water channel inlet 246 (the side where the alternate current connectors 88 and 89 are provided). The second semiconductor module 2 constituted by U2-phase, V2-phase, and W2-phase is provided on the other side (the side of the water channel outlet 248).

The direct current connector 38 to be connected with the capacitor module 390 is provided on the opposite side of the side on which the cooling water inlet 246 and the outlet 248 are provided. The alternate current connectors 88 and 89 (see FIG. 3) are mounted on an alternate current connector mounting part 123 sandwiching the positioning member 122 for the alternate current connectors, and the alternate current connector flange 91 is provided thereon. On the both sides of a capacitor module insertion part (second opening) 147 into which the capacitor module 390 (see FIG. 11) is inserted, a semiconductor module insertion water channel (first opening) 237 into which the semiconductor module 500 is inserted is formed in the lower case 142 (see FIG. 10). A thermal conduction material 600 is filled in a gap between the inner wall of the capacitor module insertion part 147 and the outer wall surface of the capacitor module 390. The thermal conduction material 600 includes resin, grease, or the like. The semiconductor modules 500 are thus arranged both sides of the capacitor module 390 so as to sandwich the capacitor module 390.

The first module lid 145 is provided on the first semiconductor module arranged on the alternate current connector side. The second module lid 146 is provided on the second semiconductor module arranged on the opposite side of the alternate current connector side. The water channel lid 144 (see FIG. 9) is provided on a front return channel 227 (see FIGS. 7 and 12) in which the water channel inlet 246 and the outlet 248 are provided. In the semiconductor module insertion water channel 237 (see FIG. 10), a rear return channel 236 is provided (see FIG. 7) on the opposite side of the above-mentioned front return channel. A first water channel forming member 490 and a second water channel forming member 491 are provided near the water channel inlet 246 and near the water channel outlet 248, respectively, so that the cooling water is guided to flow throughout the fin (side A) and the fin (side B) of the semiconductor module (see FIG. 12).

Arrangement of the semiconductor modules, the cooling water channel, and the electric system of the electric power conversion apparatus according to the present embodiment will then be described with reference to FIGS. 10 to 12. According to the present embodiment, a slot-in structure is adopted to insert the semiconductor module 500 from above into the water channel 237 formed in the lower case 142. The semiconductor module 500 is positioned by semiconductor module positioning members 502 of the lower case 142 and is fixed to the water channel 237 by a semiconductor module fixing member 501 of the module lids 145 and 146.

The semiconductor modules 500, 500, and 500 for U1-phase, V1-phase, and W1-phase shown in FIG. 3, which are arranged along a direction rearward from the first water channel forming member 490, are inserted and fixed to the water channel on the side of the alternate current connector mounting part 123, on which the alternate current connectors 88 and 89 are mounted. Likewise, the semiconductor modules 500, 500, and 500 for U2-phase, V2-phase, and W2-phase shown in FIG. 3 are inserted and fixed to the water channel on the side of the water channel outlet 248.

As shown in FIG. 12, the water enters from the water channel inlet 246, as represented by a water flow 250, and guided by the first water channel forming member 490. Flow of water, as represented by a water flow 251, is generated along the side of one of the fins of the semiconductor module 500. The water passes through or is bent through the return channel 236 in the rear section of the water channel 237 as indicated by a water flow 252, to create a water flow 253. Then, the water is guided by the first water channel forming member 490 to flow through the front return channel 227, and is guided by the second water channel forming member 491 to flow through the water channel on the side of the water channel outlet 248. The water flows through the water channel on the right side shown in FIG. 12, which is connected to the water channel outlet 248, in the same manner as through the water channel on the above-described left side.

As shown in FIG. 12, three semiconductor modules 500 are arranged on the left side of the capacitor module 390 and another three semiconductor modules 500 are arranged on the right side of the capacitor module 390. A conventional technology includes a configuration in which water channel inlet and outlet are arranged on the same side (for example, the front surface), six inverted U-shaped water channels are arranged in a direction connecting the inlet with the outlet (for example, right and left) and are connected in order with return water channels so as to dispose six semiconductor modules 500 in each of the inverted U-shaped water channels. The number of U-shaped return water channels is 11 in the configuration according to the above-described conventional technology. On the other hand, the number of U-shaped return water channels is 3 in the configuration according to the present embodiment shown in FIG. 12: Two return channels 236 (the return channels at the right top and the left top of the channel), and one return channel through which the water flow 254 and the water flow 256 pass.

While the configuration according to the above-described conventional technology includes 11 U-shaped water channels, the configuration according to the present embodiment shown in FIG. 12 includes 3 U-shaped water channels. Therefore, pressure drop due to diversion of water flow can be significantly reduced in the configuration according to the present embodiment shown in FIG. 12. The reduction in the pressure drop equalizes the speed of the water flowing through the inlet and the speed of the water flowing through the outlet. As a result, the cooling efficiency by the cooling water will not decrease so much.

As shown in FIGS. 11 and 12, the capacitor module 390 is provided with water channels on its both right and left sides and on its front (the water flow 255). Through the thermal conduction material 600, the capacitor module 390 is also cooled by the cooling water flowing through the water channels.

As shown in FIG. 11, also referring to FIG. 5, the upper surface of the capacitor module 390 occupies a considerably large area of the electric power conversion apparatus 100. Therefore, an effective use of the upper surface of the capacitor module 390 is one of the characteristic features of the present embodiment. More specifically, the upper surface of the capacitor module 390 is provided with the driver board 386 (corresponding to the driver board 74 shown in FIG. 2) thereon. On the driver board 386, the driver ICs 387 are mounted. The control board 372 is provided on the driver board 386 via a connecting member. Both of the boards 386 and 372 are electrically connected with each other via the signal connector 388 (see FIG. 5). On the control board 372, the control board ICs 373 are mounted. In the present embodiment, as described above, the upper surface of the capacitor module 390 is thus effectively used by providing the driver board and the control board thereon.

More specifically, the left semiconductor modules (for U1-phase, V1-phase, and W1-phase) shown in FIG. 11 correspond to the first inverter circuit 45 shown in FIG. 3, while the right semiconductor modules (for U2-phase, V2-phase, and W2-phase) shown in FIG. 11 correspond to the second inverter circuit 46 shown in FIG. 3. Normally, the driver board 386 is provided for each of the first inverter circuit 45 and the second inverter circuit 46. However, in the present embodiment, the driver board bridges between the first inverter circuit 45 including the left three semiconductor modules 500 shown in FIG. 11 and the second inverter circuit 46 provided on the right side (see FIG. 3). Therefore, the single driver board 386 is only necessary for two inverter circuits, i.e., the first inverter circuit and the second inverter circuit.

As shown in FIG. 10, the lower case 142 forms and functions as a channel case (the water channel 237 in FIG. 10) and as the capacitor module insertion part 147. Therefore, the lower case 142 functions as the channel case and as positioning of the capacitor module 390, thereby enabling an easy positioning of the capacitor module.

As known from the arrangement of the semiconductor modules 500 and the capacitor module 390 of the electric power conversion apparatus shown in FIG. 7 and the arrangement of the positive terminal 532 and the negative terminal 572 of each semiconductor module 500 shown in FIG. 13, the capacitor module 390 is arranged to face the fins (side B) 562. Therefore, the positive terminal and the negative terminal of the capacitor module 390 are connected with the positive terminals 532 and the negative terminals 572 of the semiconductor modules 500 through direct current bus bars that are equal to each other in length. This makes wiring easy as follows. One of the two direct current bus bars that are equal to each other in length and in structure bridges between the positive terminal 532 and the positive terminal of the capacitor module 390. The other of the two bridges between the negative terminal 572 and the negative terminal of the capacitor module 390. The direct current bus bars that are identical in shape, which is a simple structure, connect between the positive terminals and between the negative terminals of the capacitor module and each semiconductor module, so as to achieve wiring with low inductance.

Figure 21:
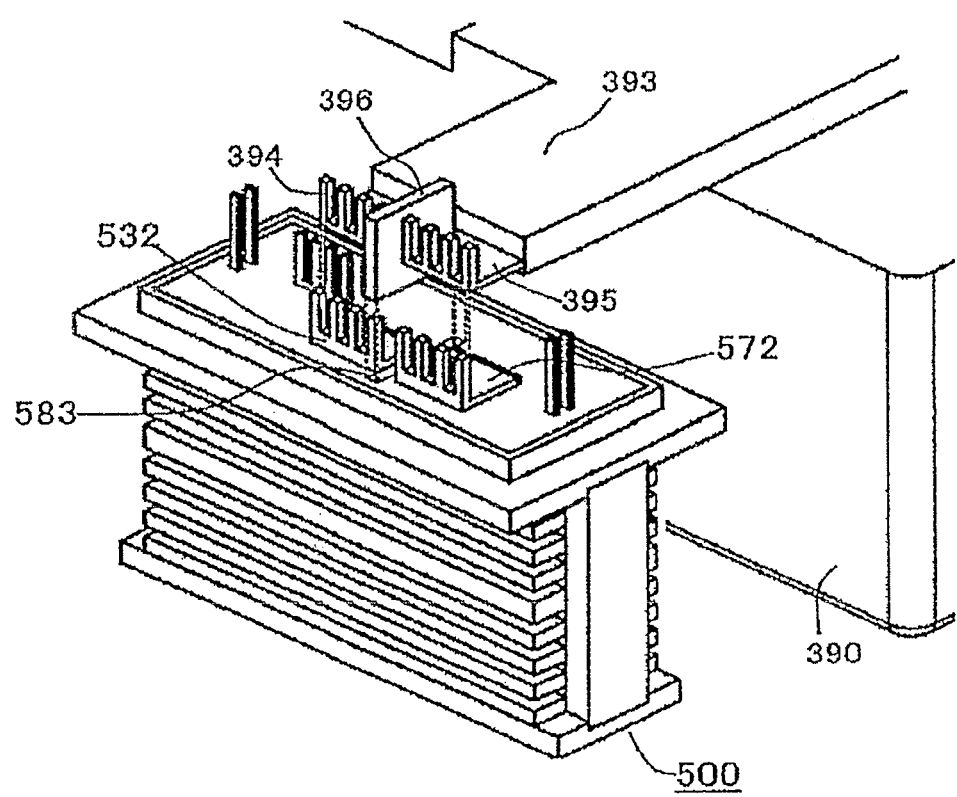
FIG. 21 is a perspective view showing a structure of a terminal connection between the semiconductor module and the capacitor module according to the present embodiment.

FIG. 21 is a perspective view showing a structure of a terminal connection between the semiconductor module and the capacitor module according to the present embodiment. FIG. 21 shows one side of the structure in which the semiconductor modules 500 sandwich the capacitor module 390.

A direct current bus bar 393 protrudes from the capacitor module 390, and is provided with a positive terminal 394 and a negative terminal 395 of the capacitor module at the end thereof. The positive terminal 394 and the negative terminal 395 are each provided with comb-like terminals set up vertically at the tip thereof. A thin, plate-shaped capacitor module terminal insulation part 396 is mounted to the direct current bus bar 393 between the positive terminal 394 and the negative terminal 395 so as to ensure insulation between these terminals. The thin, plate-shaped terminal insulation part 396 is inserted into the insertion hole 583 provided on the upper side of the semiconductor module 500 so as to determine the position of terminal connection between the semiconductor module 500 and the capacitor module 390.

This positioning stabilizes the connections between the positive terminal 532 of the semiconductor module and the positive terminal 394 of the capacitor module and between the negative terminal 572 of the semiconductor module and the negative terminal 395 of the capacitor module. In other words, the comb-like terminals are tightly attached with each other, thereby making a subsequent operation, for example, soldering easy and firm. The connecting terminals of the capacitor module 390 and the semiconductor module are each made comb-shaped so as to make welding or other fixing method of the connecting terminals easy. As illustrated, since the positive terminal 532 and the negative terminal 572 of the semiconductor module are arranged in parallel to the side of the capacitor module 390, which faces to the semiconductor module, the positive terminal 394 and the negative terminal 395 of the capacitor module can be provided with the same protrusion configuration. Since the plurality of semiconductor modules 500 are arranged next to each other along the long side of their fins, the configuration of the direct current bus bars 393 of the capacitor module for each of the semiconductor modules can be made identical.

Figure 22:
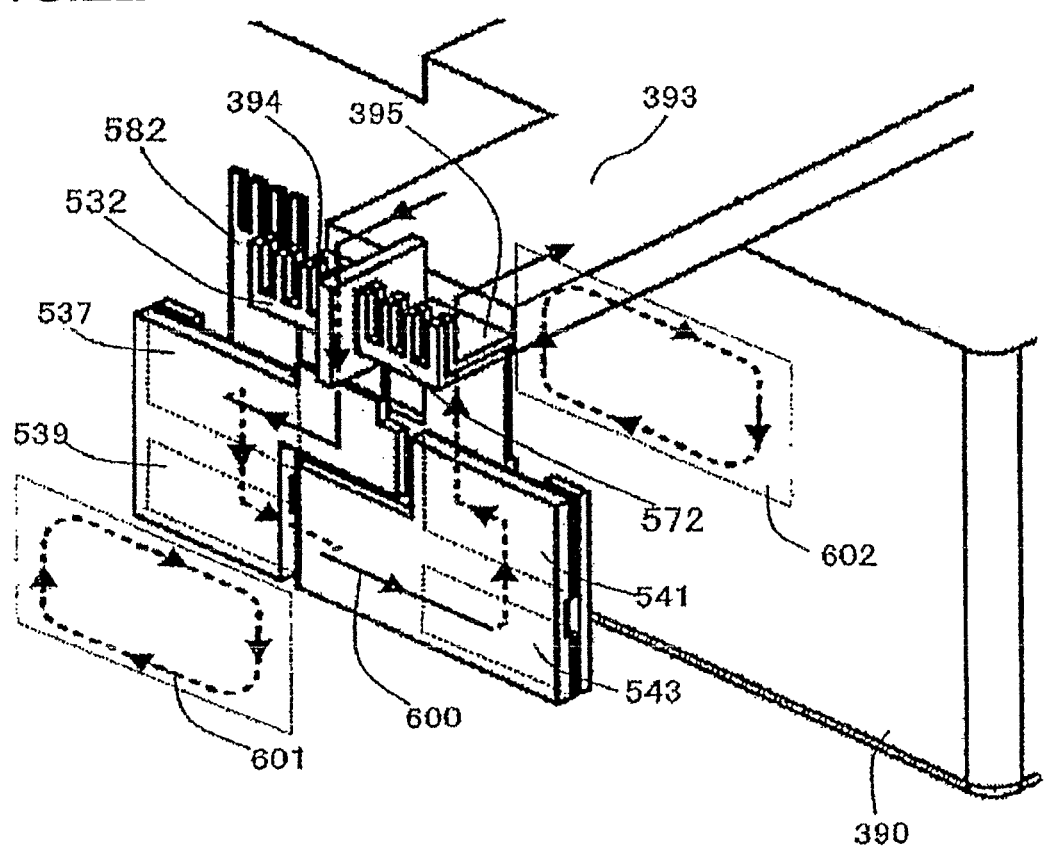
FIG. 22 is a schematic structural layout illustrating reduction of wiring inductance in the semiconductor module and the capacitor module according to the present embodiment.
Figure 23:
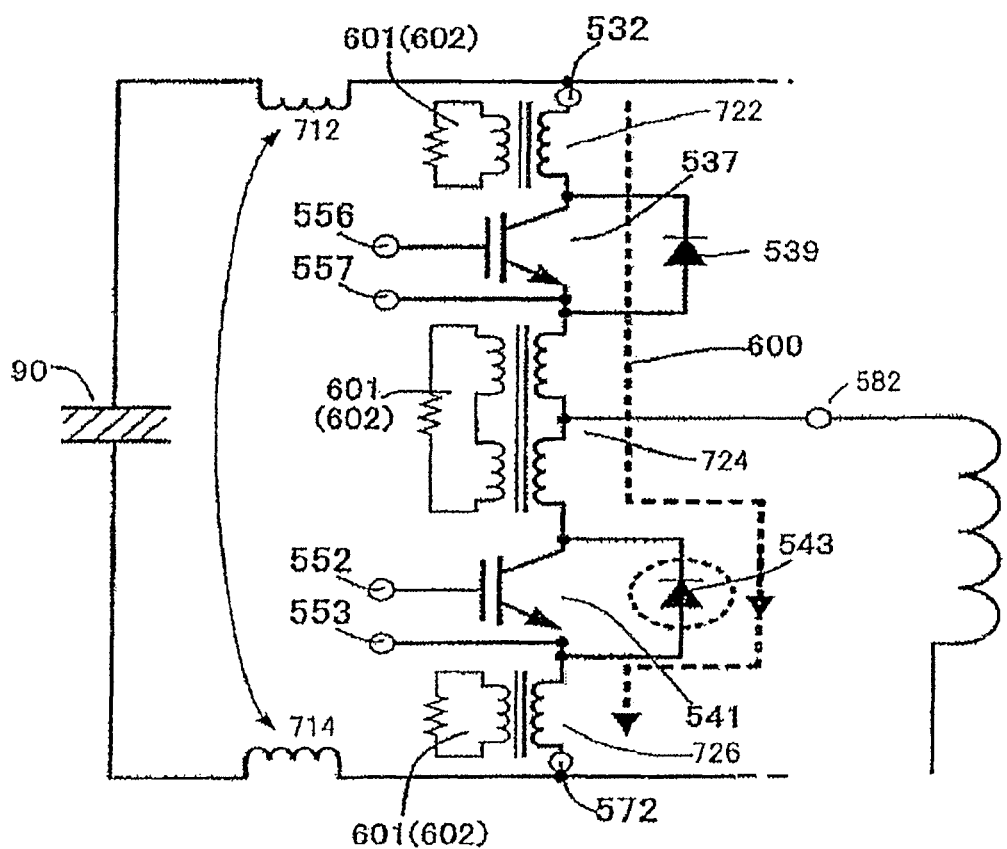
FIG. 23 is a schematic equivalent circuit diagram illustrating reduction of wiring inductance in the semiconductor module and the capacitor module according to the present embodiment.

The reduction in inductance of the semiconductor module according to the present embodiment is described with reference to FIGS. 22 and 23. FIG. 22 is a schematic structural layout illustrating reduction of wiring inductance in the semiconductor module and the capacitor module according to the present embodiment. FIG. 23 is a schematic equivalent circuit diagram illustrating reduction of wiring inductance in the semiconductor module and the capacitor module according to the present embodiment. Because a transient voltage increase and generation of a large amount of heat in the semiconductor chip occurs at the time of switching action of the upper arm and the lower arm that constitute the inverter circuit, it is desirable that the inductance is decreased particularly at the time of switching action. Based on a recovery current 600 of a diode, which is generated upon transient time, the effect of reduction in inductance will be described with an example of the recovery current of the diode 543 (corresponding to the diode 66 shown in FIG. 2) of the lower arm.

The recovery current of the diode 543 means current that flows through the diode 543 in spite of reverse bias. This is generally said to be caused by carriers filled in the diode 543 in a forward state of the diode 543. When conducting action and blocking action of the upper arm and the lower arm that constitutes the inverter circuit are performed in a predetermined order, three-phase alternate current is generated in the AC terminal 582 of the inverter circuit. More particularly, when the semiconductor chip 537 acting as the upper arm is switched from a conducting state to a blocking state, a return current flows through the diode 543 of the lower arm in a direction for maintaining the current of a stator coil of the motor generator 92 (see FIG. 2). The return current is a forward current of the diode 543 and the inside of the diode is filled with carriers. When the semiconductor chip 537 acting as the upper arm is switched from a blocking state to a conducting state, the recovery current due to above-mentioned carriers flows in the diode 543 of the lower arm. During steady operations, one of the upper arm and the lower arm of the upper and lower arms series circuit is in a blocking state, so that no short-circuit current flows through the upper and the lower arms. However, the current in a transient state, for example, the recovery current of a diode, flows through the series circuit constituted by the upper and the lower arms.

In the configuration shown in FIGS. 22 and 23, when the IGBT 537 (switching semiconductor element) acting as the upper arm of the upper and lower arms series circuit is changed from OFF to ON, the recovery current of the diode 543 flows from the positive electrode terminal 532 (corresponding to the terminal 57 of FIG. 2) to the negative electrode terminal 572 (corresponding to the terminal 58 of FIG. 2) via the IGBT 537 and the diode 543 (as indicated by arrows in FIG. 22). At this moment, the IGBT 541 is in a blocking state. The recovery current flows as follows. As shown in FIG. 22, in the path from the semiconductor chip 537 to the positive electrode terminal 532 and the path from the semiconductor chip 543 to the negative electrode terminal 572, the conductor plates are arranged vertically and in parallel with each other, and the same current flows but in opposite directions. Then, magnetic fields generated by the respective currents cancel each other in the space between the conductor plates, resulting in a decrease in inductance of the current path.

The conductor plate 534 and the positive electrode terminal 532 on the positive electrode side and the conductor plate 574 and the negative terminal 572 on the negative electrode side are arranged closely against each other. This arrangement is referred to as a laminate arrangement. The laminate arrangement causes an effect of reducing inductance. FIG. 23 shows an equivalent circuit of the device of FIG. 22. An equivalent coil 712 of the conductor plate 534 on the positive electrode side and the positive electrode terminal 532 and an equivalent coil 714 of the conductor plate 574 on the negative electrode side and the terminal 572 interact with each other so as to cancel their magnetic fluxes to decrease inductance.

The path of the recovery current shown in FIG. 22 includes the paths through which the current flows in the opposite directions in parallel and an additional path in the form of a loop. When current flows through the loop-shaped path, eddy currents 602 and 601 flow in the fin (side A) and the fin (side B). Due to the effect of canceling magnetic fluxes by the eddy currents, the inductance in the loop-shaped path is decreased. In the equivalent circuit shown in FIG. 23, the phenomenon in which eddy current is generated is equivalently expressed by inductances 722, 724, and 726. These inductances are arranged close to the metal plates that serve as the fins, so that the eddy current generated by induction and the generated magnetic flux cancel each other. As a result, the inductance of the semiconductor module is decreased by the effect of eddy current.

As described above, by the arrangement of the circuitry of the semiconductor module according to the present embodiment, more particularly, by the effect of the laminate arrangement and the effect of eddy current, inductances can be decreased. It is important to decrease the inductance at the time of the switching action. In the semiconductor module of the present embodiment, the upper and lower arms series circuit is housed in the semiconductor module. This provides a significant effect of decreasing inductance in a transient state. For example, it is possible to decrease inductance for the recovery current of the diode that flows through the upper and lower arm series circuit.

Decreasing inductance results in lowering an induction voltage generated in the semiconductor module and in obtaining a circuitry having a low loss. In addition, lowering induction results in improving the switching speed. When attempts are made to increase capacity by arranging a plurality of the semiconductor modules 500 each including the above-mentioned upper and lower arms series circuit 50 in parallel and connecting them to the capacitors 90 in the capacitor module 390, respectively, a decrease in inductance of each semiconductor module 500 decreases influence of fluctuation of inductance by the semiconductor modules in the electric power conversion apparatus 100, so that the action of the inverter device becomes more stable.

When a motor generator is required to have a high capacity (for example, 400 A or more), a capacitor is also required to have a high capacity. When a multitude of capacitors 90 are connected in parallel and the direct current bus bars 393 are arranged in parallel, the positive electrode terminal 532 and the negative electrode terminal 572 of each of the semiconductor modules are connected to each capacitor terminal at an equal distance. That is, the positive terminal and the negative terminal of each semiconductor module 500 and the terminals of each capacitor 90 are connected through DC bus bars (connecting members) 393 identical to one another in shape and in length. Such connection can also be achieved by the structure shown in FIG. 21. This makes the current that flows in each of the semiconductor modules uniformly distributed, enabling the motor generator to operate in good balance at a low loss. By parallelly arranging the positive electrode terminal and the negative electrode terminal of the semiconductor module, inductance is decreased due to the effect of laminate arrangement and it is possible to operate the motor generator at a low loss.

As described above, the electric power conversion apparatus according to the embodiment of the present invention uses the double side cooling semiconductor module so as to improve miniaturization, assemblability, and cooling efficiency. The capacitor module insertion part is provided in the center of the substantially rectangular parallelepiped channel case in which the water channel inlet and the outlet are provided on the same side thereof. The water channel that extends from the water channel inlet to the water channel outlet is provided on the both sides of the center described above. The plurality of semiconductor modules are slotted in to the water channel along the long side of the fins of the semiconductor modules. The configuration described above is assumed to be a basic structure. In the basic structure, the first and second alternate current connectors are provided on a side other than the side on which the water channel inlet and the outlet are provided. The direct current connector is provided on yet another side.

In this basic structure, the driver board of the upper and lower arms series circuit incorporated in the semiconductor module is provided on the upper surface of the capacitor module. The control board is provided on the driver board. Thus, an effective use of the upper surface of the capacitor module is addressed for the overall configuration.

The configuration of the water channel and the plurality of semiconductor modules shown in FIG. 12 reduces the number of U-turns in the water flow. Accordingly, pressure drop due to diversion of water flow is significantly reduced. The sandwich configuration of the capacitor module and the water channel shown in FIG. 12 enables the capacitor to be cooled by the cooling water flowing through the water channel. The arrangement of the positive terminal and the negative terminal of the semiconductor module shown in FIG. 13 allows the direct current bus bars with an identical structure to be used to connect these terminals with the corresponding terminals of the capacitor module, achieving low inductance wiring. The upper surface of the capacitor module is effectively utilized by providing the driver board and the control board thereon. Even if the electric power conversion apparatus is configured to include two inverter circuits, a single driver board can be used as a common driver board. The positioning of the capacitor module is secured and made easy by providing the capacitor module insertion part in the water channel chassis formed by the lower case.

As shown in FIG. 14, the IGBT of the upper arm and the IGBT of the lower arm incorporated in the semiconductor module have their length L along the vertical direction, and are arranged along the direction of water flowing through the water channel. Similarly, the diodes of the upper arm and the lower arm with their length M along the vertical direction are disposed below the IGBTs. Therefore, there is no unnecessary length in the vertical direction of the semiconductor module, leading to miniaturization. The IGBT, which is to be cooled primarily, occupies an area of the water channel corresponding to the length L (the vertical length of the fin), which is longer than the length M. This contributes to improvement in the cooling efficiency.

Figure 24:
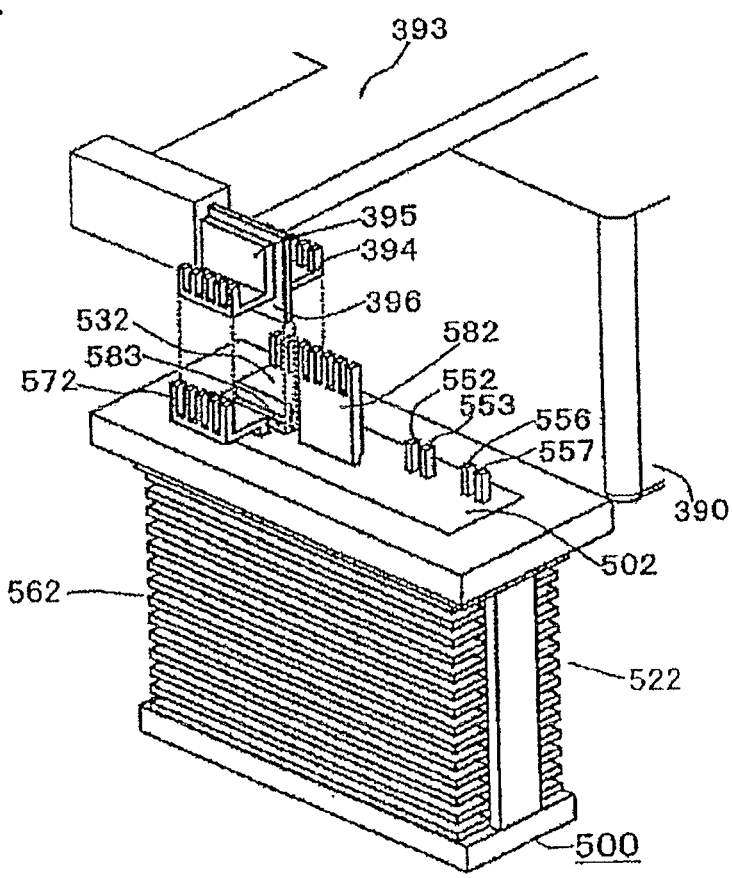
FIG. 24 is a perspective view showing another example of an arrangement of a positive terminal and a negative terminal of the semiconductor module according to the present embodiment.

Another example of the arrangement of the positive and the negative terminals of the semiconductor module according to the present embodiment will now be described with reference to FIG. 24. The semiconductor module shown in FIG. 21 has the structure in which the positive terminal 532 and the negative terminal 572 are arranged so that the comb-like terminals which are set up vertically are arranged along the direction of the water flowing through the fin (side A) 522 (see FIG. 13). As shown in FIG. 24, on the other hand, the comb-like terminals of the positive terminal 532 and the negative terminal 572 are configured to face each other along the short side of the semiconductor module. That is, the teeth of the comb-shaped positive terminal 532 are arranged along the direction of the water flow on the side of the fin (side A) 522, while the teeth of the comb-shaped negative terminal 572 are arranged along the direction of the water flow on the side of the fin (side B) 562. The teeth of the comb-shaped positive terminal and the teeth of the comb-shaped negative terminal face each other along the short side of the semiconductor module. Only difference between the configurations shown in FIGS. 24 and 21 is the arrangement of the positive terminal 532 and the negative terminal 572. It is to be noted that the arrangement of other terminals may differ to a certain extent.

The conducting plate 534 (positive electrode side) and the conducting plate 574 (negative electrode side) are each provided with bends so as to form the comb-shaped terminals facing each other as illustrated. The terminal insulation part insertion hole 583 is provided between the conducting plates 534 and 574 of the terminals 532 and 572 of the semiconductor module so as to correspond to the terminal insulation part 396 of the capacitor module. In accordance with the arrangement of the positive and negative terminals of the semiconductor module 500 described above, the positive terminal 394 and the negative terminal 395 of the capacitor module 390 are arranged. More specifically, the angles between the direct current bus bar 393 and the positive and negative terminals and between the direct current bus bar 393 and the terminal insulation part are shifted by 90 degrees to the arrangement shown in FIG. 21. That is, the example of another configuration shown in FIG. 24 can be achieved only by changing the configuration of the positive and the negative terminals of the semiconductor module and the capacitor module.

Figure 26A:
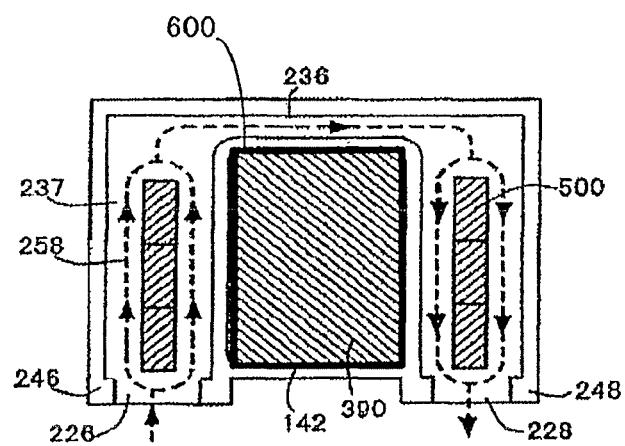
FIGS. 26A and 26B show explanatory diagrams illustrating other configuration examples of a water channel and a plurality of semiconductor modules according to the present embodiment.
Figure 26B:
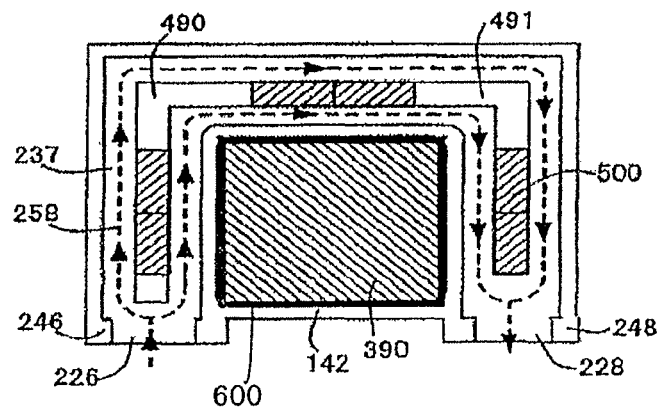

Configuration examples of a water channel and a plurality of semiconductor modules according to the present embodiment will now be described with reference to FIGS. 25A to 26B. FIGS. 25A to 25C show explanatory diagrams illustrating configuration examples of a water channel and a plurality of semiconductor modules according to the present embodiment. FIGS. 26A and 26B show explanatory diagrams illustrating other configuration examples of a water channel and a plurality of semiconductor modules according to the present embodiment.

In FIGS. 25A to 26B, reference numeral 142 designates a lower case; 226 designates a front inlet water channel; 227 designates a front return water channel; 228 designates a front outlet water channel; 236 designates a rear return water channel; 237 designates a semiconductor module insertion channel; 246 designates a water channel inlet; 248 designates a water channel outlet; 258 designates a water flow; 390 designates a capacitor module; 490 designates a first water channel forming member; 491 designates a second water channel forming member; 500 designates a semiconductor module; and 600 designates a thermal conduction material.

FIG. 25A illustrates the configuration of the water channel and the semiconductor modules shown in FIG. 12 whose structure and function are described with reference to FIG. 12. FIG. 25B illustrates a variation of the configuration of the water channel which intends to improve cooling efficiency of the capacitor module and to reduce pressure loss of the cooling water flowing through the water channel. The variation shown in FIG. 25B is explained as follows in contrast to the example in FIG. 25A. In FIG. 25A, three semiconductor modules are inserted into the inlet water channel 226. As shown in FIG. 25A, the cooling water first cools the semiconductor modules provided close to the inlet water channel 226, and then cools the semiconductor modules provided close to the outlet water channel 228. Therefore, temperature of the cooling water that is exposed to the semiconductor modules deviates between vicinity of the inlet water channel 226 and vicinity of the outlet water channel 228, resulting in nonuniformity of cooling.

In FIG. 25B, on the other hand, the first water channel forming member 490 is provided in the rear so as to form the return water channels 236. Therefore, one side, that is, the fin (side A) 522 or the fin (side B) 562 shown in FIG. 13, of the semiconductor modules 500 provided in vicinity of the inlet water channel 226 and the outlet water channel 228 is cooled first, and the other side is cooled last. This has the advantage of relative uniformity in the cooling of the semiconductor modules 500.

FIG. 25C illustrates a variation of the water channel in which the return water channels 236 are provided in the rear as in FIG. 25B, as well as the first water channel forming member 490 and the second water channel forming member 491 are disposed as illustrated. A plurality of semiconductor modules 500 are divided into three units each provided near each side of the rectangular case. For example, the semiconductor modules 500 are divided into the three units so as to include one of the semiconductor modules of U-phase, V-phase, and W-phase, assuring thermal balance for each of the phases. This has the advantage of preventing any one of the phases from being heated to a high temperature.

FIGS. 26A and 26B show other variations of the water channel in which the water channel inlet 226 and the water channel outlet 228 are not provided with water channel forming members thereat, but a water channel is provided in the rear. In the variation shown in FIG. 26A, the water channel forming members 490 and 491 are omitted all through the water channel from the water channel inlet to the water channel outlet, reducing production cost. In comparison with the water channels shown in FIGS. 25A to 25C, the number of turning points in the water channel can be reduced, and by branching the water flow, the cooling water flows slower through each water path, reducing the pressure loss in the water channel.

FIG. 26B shows a variation in which the semiconductor modules for each of the phases are provided along each of the sides of the water channel. In comparison with the variations in FIGS. 25A to 25C, the number of turning points in the water channel can be reduced, and by branching the water flow, the cooling water flows slower through each water path, reducing the pressure loss in the water channel.

According to the above explained embodiments of the present invention, the water channel case which also functions as the lower case is provided with openings in which the semiconductor modules and the capacitor module are arranged on the substantially same plane, so that the semiconductor modules are arranged to sandwich the capacitor module. This arrangement results in improvement in miniaturization, cooling efficiency, assemblability, and product reliability of the electric power conversion apparatus.

The above-described embodiments are examples, and various modifications can be made without departing from the scope of the invention.

What is claimed is:

1. A power semiconductor module, comprising:
   a first semiconductor chip of an upper arm of an inverter circuit;
   a second semiconductor chip of a lower arm of the inverter circuit;
   a first conductor plate that is electrically connected with a first surface of the first semiconductor chip;
   a second conductor plate that is electrically connected with a second surface of the first semiconductor chip;
   a third conductor plate that is electrically connected with a first surface of the second semiconductor chip and the second conductor plate;
   a fourth conductor plate that is electrically connected with a second surface of the second semiconductor chip;
   a first gate conductor that is electrically connected with a gate terminal of the first semiconductor chip;
   a second gate conductor that is electrically connected with a gate terminal of the second semiconductor chip;
   a first metal plate on which the first conductor plate, the third conductor plate, the first gate conductor, and the second gate conductor are fixed in a same first plane via a first insulating member; and
   a second metal plate on which the second conductor plate and the fourth conductor plate are fixed in a same second plane via a second insulating member.

2. The power semiconductor module according to claim 1, wherein
   each of the first metal plate and the second metal plate integrally has heat dissipation fins.

3. The power semiconductor module according to claim 1, wherein
   each of the first metal plate and the second metal plate is joined to heat dissipation fins provided separately.

4. The power semiconductor module according to claim 1, wherein
   each of the first insulating member and the second insulating member is a ceramic board.

5. The power semiconductor module according to claim 4, wherein
   the ceramic board has a thickness of 350 micrometers or less.

6. The power semiconductor module according to claim 1, wherein
   each of the first insulating member and the second insulating member is a resin insulating sheet.

7. The power semiconductor module according to claim 6, wherein
   the resin insulating sheet has a thickness of 50 micrometers or more and 200 micrometers or less.

8. The power semiconductor module according to claim 1, further comprising:
   a first gate terminal electrically connected to the first gate conductor and drawn out from a region sandwiched between the first metal plate and the second metal plate; and
   a second gate terminal electrically connected to the second gate conductor and drawn out from a region sandwiched between the first metal plate and the second metal plate.

9. The power semiconductor module according to claim 1, further comprising:
   a positive terminal electrically connected to the first conductor plate and drawn out from a region sandwiched between the first metal plate and the second metal plate; and
   a negative terminal electrically connected to the fourth conductor plate and drawn out from a region sandwiched between the first metal plate and the second metal plate, wherein
   the first semiconductor chip includes a first IGBT and a first diode,
   the second semiconductor chip includes a second IGBT and a second diode,
   the first semiconductor chip and the second semiconductor chip are arranged such that an arrangement position of the first IGBT, the first diode, the second diode, and the second IGBT overlaps each vertex of a quadrangle in a region sandwiched between the first metal plate and the second metal plate, and
   a connection position of the second conductor plate and the third conductor plate is formed on the side of the quadrangle opposite to the direction in which the positive terminal and the negative terminal are drawn out.

10. A power converter comprising:
    the power semiconductor module according to claim 1;
    a capacitor module electrically connected to the power semiconductor module; and
    a coolant passage in which a coolant is configured to flow.

11. The power converter according to claim 10, wherein
    the coolant passage includes a first flow path that flows on one side of the power semiconductor module, a second flow path that flows on another side of the power semiconductor module, and a folded flow path that connects the first flow path and the second flow path, and
    the capacitor module is provided at a position facing the power semiconductor module across the first flow path.

* * * * *